US011127835B2

(12) United States Patent
Posseme et al.

(10) Patent No.: US 11,127,835 B2
(45) Date of Patent: Sep. 21, 2021

(54) METHOD FOR ETCHING A THREE-DIMENSIONAL DIELECTRIC LAYER

(71) Applicant: Commissariat A L'Energie Atomique et aux Energies Alternatives, Paris (FR)

(72) Inventors: Nicolas Posseme, Grenoble (FR); Vincent Ah-Leung, Grenoble (FR); Olivier Pollet, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 17 days.

(21) Appl. No.: 16/722,390

(22) Filed: Dec. 20, 2019

(65) Prior Publication Data

US 2020/0251570 A1    Aug. 6, 2020

(30) Foreign Application Priority Data

Dec. 20, 2018 (FR) .................................... 18 73686

(51) Int. Cl.
*H01L 29/66* (2006.01)
*H01L 21/02* (2006.01)
(Continued)

(52) U.S. Cl.
CPC ...... *H01L 29/6653* (2013.01); *H01L 21/0223* (2013.01); *H01L 21/31116* (2013.01);
(Continued)

(58) Field of Classification Search
CPC ............. H01L 29/6653; H01L 21/0223; H01L 21/31116; H01L 29/0649; H01L 29/66795; H01L 29/785; H01L 21/31144
(Continued)

(56) References Cited

U.S. PATENT DOCUMENTS 9,390,981 B1 *  7/2016  Basker ................ H01L 21/8238
9,607,840 B2    3/2017  Posseme
(Continued)

FOREIGN PATENT DOCUMENTS

EP          3 107 118 A1    12/2016

OTHER PUBLICATIONS

French Preliminary Search Report dated Nov. 8, 2019 in French Application 18 73686 filed on Dec. 20, 2018 (with English Translation of Categories of Cited Documents & Written Opinion), 10 pages.

*Primary Examiner* — Mohammad M Hoque
(74) *Attorney, Agent, or Firm* — Oblon, McClelland, Maier & Neustadt, L.L.P.

(57) ABSTRACT

There is provided a method for etching a dielectric layer covering at least partially a flank of a structure made of a semi-conductive material, the structure having at least one face, the method including a plurality of sequences, each including at least the following steps: a main oxidation so as to form an oxide film; a main anisotropic etching of the oxide film, carried out so as to etch a portion of the oxide film extending parallel to the flanks and at least some of the dielectric layer, be stopped before etching the structure and a whole thickness of another portion of the oxide film extending perpendicularly to the flanks, the steps being repeated until the complete removal of the dielectric layer located on the flanks of the structure.

20 Claims, 10 Drawing Sheets

(51) Int. Cl.
    *H01L 21/311*     (2006.01)
    *H01L 29/06*     (2006.01)
    *H01L 29/78*     (2006.01)

(52) U.S. Cl.
    CPC .... *H01L 29/0649* (2013.01); *H01L 29/66795* (2013.01); *H01L 29/785* (2013.01)

(58) Field of Classification Search
    USPC .......................................................... 438/157
    See application file for complete search history.

(56) References Cited

U.S. PATENT DOCUMENTS

| | | | |
|---|---|---|---|
| 2013/0252430 A1* | 9/2013 | Ranjan | H01L 29/4983 438/696 |
| 2016/0020152 A1* | 1/2016 | Posseme | H01L 21/31144 438/696 |
| 2016/0079396 A1 | 3/2016 | Posseme et al. | |
| 2016/0372331 A1 | 12/2016 | Posseme | |
| 2017/0358502 A1 | 12/2017 | Grenouillet et al. | |
| 2020/0027979 A1* | 1/2020 | Zang | H01L 21/823468 |

\* cited by examiner

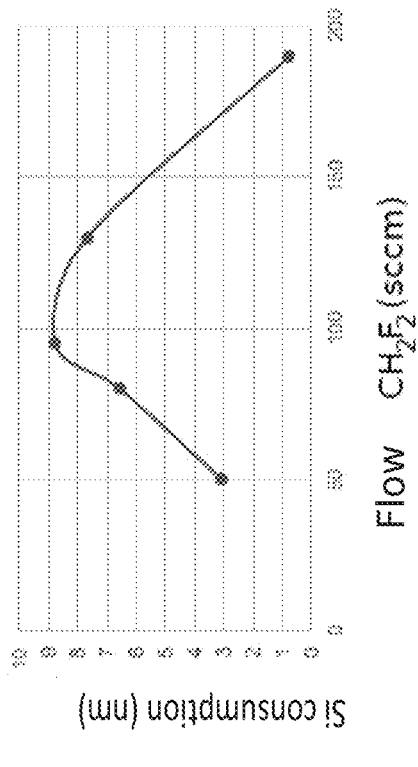
FIG. 7A
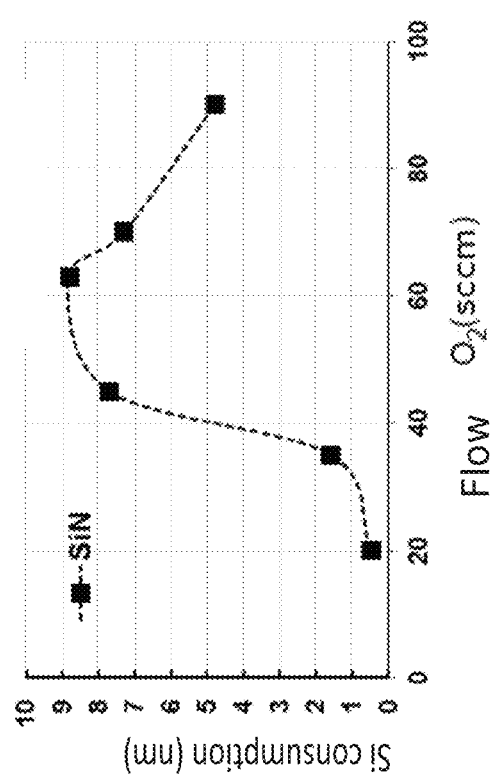
FIG. 7B
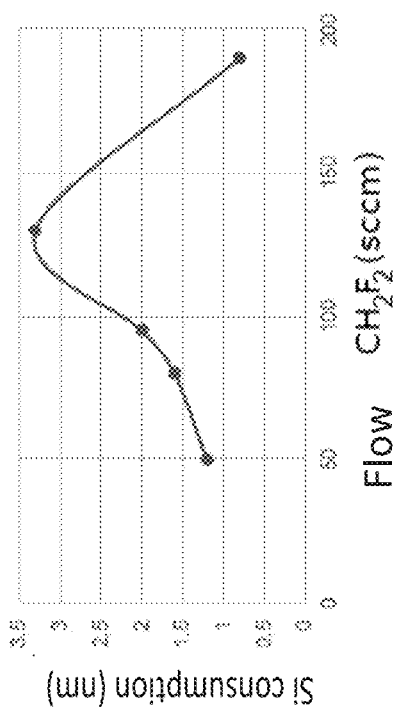
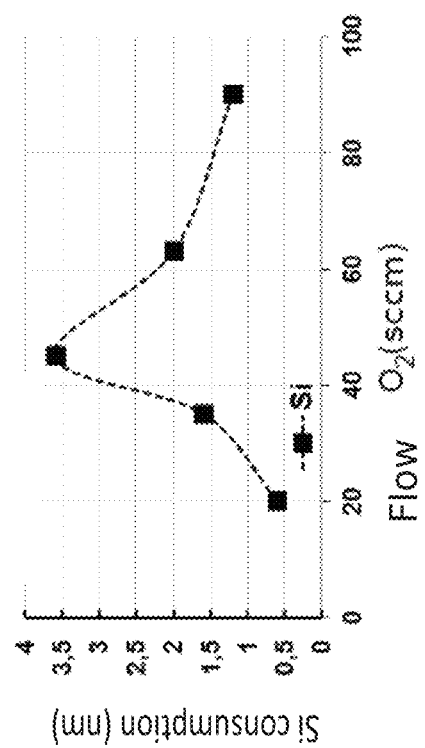

METHOD FOR ETCHING A THREE-DIMENSIONAL DIELECTRIC LAYER

TECHNICAL FIELD

The present invention generally relates to the etching of layers on microelectronic structures, in particular, three-dimensional (3D).

It has a particularly advantageous application in producing so-called FinFET-type transistors, i.e. field-effect transistors (FET), of which the conduction channel comprises a thin vertical strip of a semi-conductive material, called a Fin.

STATE OF THE ART

With the action of constantly seeking to reduce dimensions which characterises the whole microelectronics industry, a particular difficulty consists of etching in a precise manner, a layer located on some or on all of the faces of a 3D structure without damaging or consuming the 3D structure.

Such is, for example, the case for the dielectric layer intended to form spacers of a gate of a FinFET-type transistor and which is arranged on the Fins of the transistor as will be explained below.

A Fin-FET-type transistor 100 is illustrated in FIG. 1. In this three-dimensional device, the conduction channel 110 is constituted of a thin vertical layer of semi-conductive material, typically made of silicon. The strip forming the channel 110 is surrounded on three sides by the gate 130. The strip passes through either side of the gate 130 and is extended to form, on either side of the gate 130, Fins 30. These Fins thus constitute three-dimensional (3D) structures.

With respect to conventional transistors, these FinFET devices make it possible to reduce leakage current and to obtain transistors having better electrical performances. The FinFET device above can be made from an SOI substrate, where the buried protective layer BOX 20 and the support substrate 10 are located. The presence of a hard mask 150 at the top of the gate 130 will also be noted.

It will be noted, that according to other embodiments, numerous FinFET transistor are manufactured on bulk substrates. In this case, the strip extends vertically to the silicon of the bulk substrate. The gate pattern itself rests on a dielectric layer.

Whatever the substrate on which it is manufactured, the FinFET device 100 requires that it is known to produce spacers 140 on the flanks of the gate 130. These spacers 140 in particular have the function of protecting the flanks of the gate 130 during subsequent implantation phases.

To form these spacers 140, first a deposition is made of a uniform layer of a dielectric material on all the surfaces of the device 100.

As is illustrated in FIG. 1, it must be able to be obtained by etching, that only spacers 140 perpendicular to the plane of the substrate 10 remain in place on either side of the gate 130. All the other surfaces, in particular these covering the Fin 30, that they are perpendicular or parallel to the plane XY of the substrate 10, must be completely etched. This must be carried out without leaving dielectric layer residue 160 on the BOX 20 and without damaging the underlying layers to the etched dielectric layer, typically without damaging 180 the top 31 of the Fins 30 or without damaging 190 the upper face of the BOX 20. Moreover, it is important to obtain a perfectly anisotropic etching in the angles 170 without forming feet, this in order to conserve actual right-angles.

To meet this need, the conventional solution consists of using a plasma etching to etch the dielectric layer. If the plasma etching has made it possible to accompany the size reductions of the patterns up to now, the implementation thereof however poses more and more problems when the size decreases, in particular from and beyond the 32 nm technological node. The three-dimensional (3D) character of the FinFET structure means that the problems already encountered with a flat structure are even more acutely there.

In particular, it is particularly complex to fully etch the dielectric layer 40 on the top 31 and the flanks 32 of the Fin 30 without damaging the Fin 30 or leaving dielectric layer 40 residue while conserving spacers 140 on the flanks of the gate 130.

There is therefore a need consisting of proposing a solution to fully etch and with great accuracy, a dielectric layer located on the faces of a 3D structure while avoiding damaging this 3D structure.

In the particular and non-limiting scope of FinFET-type transistors, an aim of the present invention consists of proposing a solution for etching on the Fins, the dielectric layer intended to form spacers on the flanks of the gate, while avoiding, even by removing, the dielectric layer residue on either side of the Fins, as well as the consumption of layers underlying the dielectric layer such as the semi-conductive layer forming the Fin.

Moreover, this solution must not degrade the dimensional control of the spaces located on the flanks of the gate.

The other aims, features and advantages of the present invention will appear upon examining the following description and the supporting drawings. It is understood that other advantages can be incorporated.

SUMMARY

To achieve this aim, according to an embodiment, the present invention provides a method for etching a dielectric layer at least partially covering a flank of at least one structure made of a semi-conductive material, the flanks extending into the planes perpendicular to a base plane, the structure having at least one face having, projecting over the base plane and along a direction perpendicular to the base plane, a non-zero surface.

The method comprises a plurality of sequences each comprising at least the following successive steps:
  a main oxidation so as to form an oxide film, the oxide film having at least:
    at least one first portion formed on the surface of the dielectric layer and extending into at least one plane perpendicular to the base plane,
    at least one second portion formed on the dielectric layer and having, projecting along a direction perpendicular to the base plane, a non-zero surface,
    at least one third portion formed on said face and having, projecting along a direction perpendicular to the base plane, a non-zero surface, the composition of at least one second portion being different from the composition of the at least one third portion,
  a main anisotropic etching of the oxide film, by plasma, the main anisotropic etching being carried out so as to:
    have a favoured direction which is perpendicular to the base plane, etch said second first portion and at least one portion of the dielectric layer located under the second portion, i.e. to the right of the second portion along the axis Z, be stopped before etching:

said structure made of a semi-conductive material, and the portions of dielectric layer on which the first portion of the oxide film has been formed during the main oxidation step.

The sequence is repeated until the complete removal of the dielectric layer located on the flanks of said structure made of a semi-conductive material.

Thus, the method according to the invention provides, before each main anisotropic etching step, to form an oxide film on the surface of the portions of the dielectric layer covering the flanks of the structure. This oxide film extends over all the walls perpendicular to the base plane. This oxide film thus protects these walls against any undesired lateral consumption during the etching of the dielectric layer along the favoured direction. Indeed, in the scope of the development of the present invention, it has proved to be, that during an etching, even very anisotropic, the dielectric layer is laterally consumed, i.e. along a direction perpendicular to the favoured direction of the etching. This lateral consumption, even low, can have major disadvantages. Indeed, in certain zones, it is essential to perfectly control the thickness of the dielectric layer. Such is, for example, the case on the flanks of the gates of the transistors. A consumption, even low, of some of the thickness of the spacers formed by this dielectric layer can significantly degrade the performances of the transistor.

The method according to the invention makes it possible to protect these spacers during the main anisotropic etching which aims to consume the dielectric layer outside of the zones of interest.

Typically, in the case of FinFET-type transistors, and as has been indicated in the introduction, it is necessary to remove the dielectric layer on all the flanks of the Fin, while conserving the dielectric layer on the flanks of the gate.

The method according to the invention makes it possible to consume the dielectric layer perfectly anisotropically, i.e. along the favoured etching direction. It is therefore possible to remove the whole height of the dielectric layer located on the flanks of the Fin, to remove a corresponding dielectric layer height located facing the hard mask surmounting the gate, without laterally etching the portion of the dielectric layer located on the flanks of the gate.

Moreover, at each of the sequences, the main anisotropic etching is stopped before etching the structure made of semi-conductive material.

Indeed, the oxide film portions, formed on the surface of the dielectric layer have a composition, more sensitive to the etching that the oxide film portions surmounting the substrate made of semi-conductive material. Thus, during the main anisotropic etching:

the oxide film formed on the surface of the dielectric layer is etched along the favoured direction. It thus no longer protects the underlying dielectric layer which itself is etched.

the oxide film surmounting the substrate made of semi-conductive material resists the etching and acts as a protective layer to prevent the etching of the substrate made of semi-conductive material.

Thus, the present invention proposes an effective solution for fully etching and with great accuracy, the dielectric layer on the top of the faces of the 3D structure, while avoiding damaging this 3D structure.

Typically, the etching is such that it can control the stopping on the layer of semi-conductive layer on an atomic scale.

The method proposed makes it possible to significantly improve the performances of the transistors.

The solution proposed by the present invention has numerous advantages.

In particular, in the scope of the development of the present invention, it has proved to be that conventional solutions of etching spacers made of silicon nitride (SiN) which are based on the use of fluorocarbon (FC) chemistry very often induce an undesired consumption (usually qualified as a "recess") of the silicon forming the Fin of the FinFET transistor.

Indeed, it has been noted that the fluorocarbon etching of the dielectric layer induces, in addition to a silicon consumption, a modification of a superficial portion of the silicon layer. This superficial portion is transformed into a $Si_xO_yF_z$ layer which is removed during the etching or after the etching during the wet cleaning step. Moreover, this modified superficial portion induces defects during the epitaxial growth.

Moreover, to reduce this excessive consumption of silicon, it has been considered to adjust the conditions of implanting ions from plasma. In a conventional plasma, the minimum energy of the ions is around 20 eV. With this energy level, significant damage of the layer exposed to plasma is observed. A solution, which can possibly be considered by a person skilled in the art in order to limit this damage would consist of reducing the temperature Te of the electrons, which would lead to reducing the potential of the plasma and to consequently reducing the energy of the ions. Another solution, which can possibly be considered by a person skilled in the art, would consist of using a pulsed plasma. However, these two solutions are not satisfactory, or are only partially satisfactory, since:

a reduction of the temperature of the plasma leads to expanding the distribution angle of the ions, thus reducing the anisotropic character of the etching and ultimately degrading the dimensional control of the profile of the 3D structure, the use of a pulsed plasma does not make it possible to completely eliminate the damage of the layer underlying the dielectric layer that is sought to be etched.

Thus, at best, a person skilled in the art would have available to them, solutions obligating them to make a compromise between damaging the underlying layer and dimensional control of the profile.

Another aspect of the present invention relates to a method for producing a FinFET transistor surmounting a support substrate, the FinFET transistor comprising a gate and at least one channel passing through the gate. The channel extends from a flank of the gate to form at least one structure, preferably made of a semi-conductive material, said structure having a top and at least two flanks.

The method comprises:

the deposition, preferably conform, of a dielectric layer covering the gate and said structure, the etching of the dielectric layer by implementing the method according to any one of the embodiments of the etching method according to the invention, so as to completely remove the dielectric layer located on the structure formed by the channel.

Optionally, the method for producing a FinFET transistor can comprise at least any one of the following features taken individually or in combination:

According to an embodiment example, the transistor has a hard mask covering a top of the gate, the dielectric layer being deposited on the hard mask, the hard mask having a thickness $e_{150}$, such that $e_{150} \geq e_{30}$, $e_{30}$ being the thickness of said structure, and preferably $e_{150} \geq 1.2 \times e_{30}$.

Thus, when the etching fully consumes the dielectric layer located on the flanks of the structure, the whole height of the flanks of the gate remains covered by the dielectric layer. Consequently, the removal of the dielectric layer on the flanks of the Fin does not lead to the removal of this dielectric layer on the flanks of the gate. The latter therefore remain effectively protected by the spacers.

The thicknesses of the hard mask and of the structure are taken along directions perpendicular (Z) to the main plane (XY), wherein the support substrate extends.

Another aim of the present invention relates to a microelectronic device comprising a plurality of FinFET transistors according to the invention. By microelectronic device, this means any type of device made with the microelectronic means. These devices in particular, in addition comprise devices with a purely electronic purpose, micromechanical devices or electromechanical devices (MEMS, NEMS, etc.) as well as optical or optoelectronic devices (MOEMS, etc.).

BRIEF DESCRIPTION OF THE FIGURES

The aims, objectives, as well as the features and advantages of the invention will best emerge from the detailed description of embodiments of the latter which are illustrated by the following supporting drawings, wherein:

FIG. 7 comprises FIGS. 7A and 7B which each comprise graphs illustrating the consumption of the dielectric layer and the consumption of the semi-conductive layer according to the presence of $CH_2F_2$ (for FIG. 7A) and of $O2$ (for FIG. 7B) in plasma.

Figure 1:
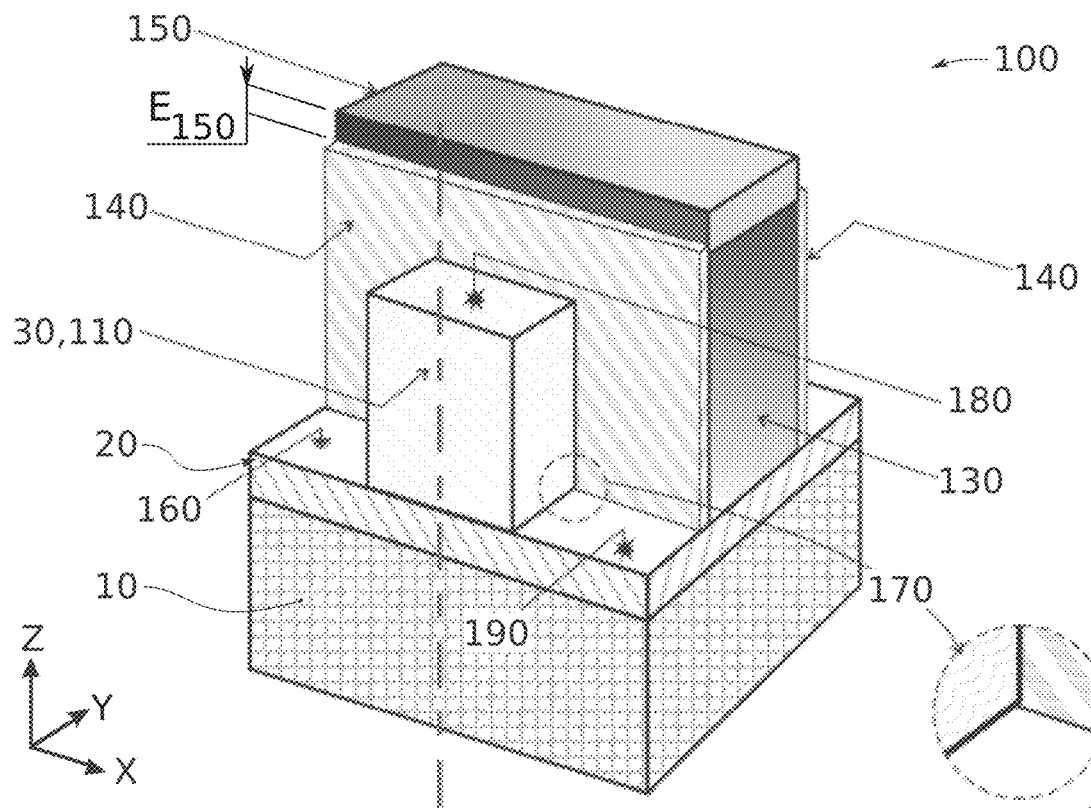
FIG. 1 schematically illustrates a FinFET-type transistor.
Figure 2:
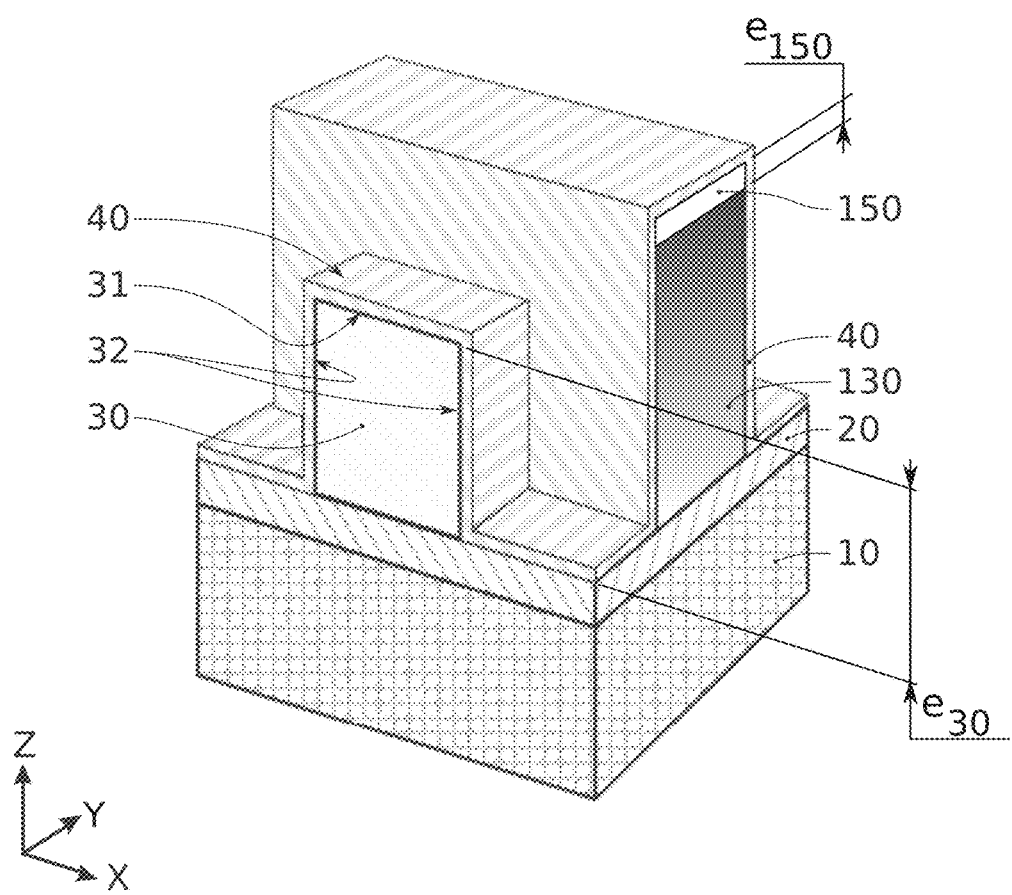
FIG. 2 schematically illustrates a FinFET-type transistor during production, a conform dielectric layer being deposited on all the surfaces of the transistor.

The drawings are given as examples and are not limiting of the invention. They constitute principle schematic representations intended to facilitate the understanding of the invention and are not necessarily to the scale of practical applications. In particular, the relative thicknesses of the different layers, protective oxide layer and oxide films are not representative of reality.

In particular, the thickness of the oxide film is voluntarily exaggerated.

DETAILED DESCRIPTION

Before starting a detailed review of embodiments of the invention, below optional features are stated, which can possibly be used in association or alternatively:

According to an example, the main anisotropic etching of the oxide film, by plasma, a fluorocarbon chemistry.

According to an example, said structure forms at least one Fin of a FinFET-type transistor.

According to an example, the second portion extends along at least one plane non-perpendicular to the base plane (XY).

According to an example, the third portion extends along at least one plane non-perpendicular to the base plane (XY).

According to an example, said structure is surmounted by a gate pattern having flanks covered by the dielectric layer, the gate pattern being surmounted by a hard mask of which the height is greater than or equal to the height of said structure, the heights and being taken along said favoured direction (Z).

According to an example, the main oxidation is carried out in a plasma etching reactor and said main anisotropic etching is carried out in the same plasma etching reactor.

This makes it possible to considerably simplify and shorten the manufacturing cycles. This results in a reduced manufacturing cost.

According to an embodiment, the deposition of said dielectric layer is a conform deposition.

According to an embodiment, the main anisotropic etching is stopped before consuming the whole thickness of the first portion of the oxide and nitride film, said thickness being measured along a direction parallel to the base plane or at the very least before etching, along a direction parallel to the base plane, the dielectric layer extending along planes perpendicular to the base plane. Thus, the dimensional control of the portions of dielectric layer intended to form the gate spacers is conserved.

The main anisotropic etching is time-controlled.

According to an example, prior to said plurality of sequences, the method comprises:

a step of depositing the dielectric layer such that the dielectric layer covers the flanks and the face of said structure, an initial etching step, carried out anisotropically along said favoured direction so as to remove at least one portion of the dielectric layer located on at least one portion of the face of said structure, the initial etching being stopped before consuming the face of the structure.

According to an example, after the step of depositing the dielectric layer and before the initial etching step, the method comprises an initial oxidation step, carried out so as to form an initial oxide film over the whole surface of the dielectric layer.

Advantageously, this initial oxide film makes it possible to limit the lateral consumption of the dielectric layer during the initial etching step. Thus, during the initial etching step, the dimensional control of the dielectric layer located on the flanks is conserved.

According to an example, the initial etching step is stopped before consuming the whole thickness of portions of the initial oxide film located on surfaces of the dielectric layer extending into planes perpendicular (YZ, ZX) to the base plane (XY).

Thus, the initial etching is stopped:
either before etching the semi-conductive structure such as a FinFET transistor Fin,
or before laterally etching the dielectric layer, of which some portions are for example intended to form the gate spacers.

According to an example, the initial etching step is a plasma etching based on a fluorocarbon chemistry, and preferably a $C_xH_yF_z$-based chemistry diluted with one or more from among the following types: argon, helium, nitrogen, oxygen.

According to an embodiment, prior to said plurality of sequences, the dielectric layer covers the flanks of said structure, at least one portion of the face of said structure not being covered by the dielectric layer.

According to an example, during said main oxidation step, the at least one third portion of the oxide film is formed by oxidation of said face of the structure, the composition of the second portion of the oxide film being different from the composition of the third portion of the oxide film and said main anisotropic etching being configured so as to etch the second portion of the oxide film more rapidly than the third portion of the oxide film.

According to an example, the composition of the second portion of the oxide film, from the main oxidation step, and before the main anisotropic etching step, is $Si_xO_yN_zF_t$ and the composition of the third portion of the oxide film is $Si_xO_yF_z$, x, y, z and t being non-zero integers.

According to an embodiment, the dielectric layer is formed of $Si_xN_y$, x and y being non-zero integers. Typically, it is formed of $Si_3N_4$.

According to an example, the main anisotropic etching of the oxide film is carried out so as to be stopped before etching the whole thickness of said third portion of the oxide film.

According to an example, the main oxidation is carried out in a plasma etching reactor, by using a bias voltage less than or equal to 50 Volts, preferably less than 30 Volts.

This bias voltage makes it possible to avoid submitting said structure to a bombardment that is too high, which is particularly advantageous when said structure is silicon-based.

Preferably, all the steps of this embodiment are carried out in the same reactor.

This embodiment makes it possible, with a reduced number of steps and a great reliability, of etching very anisotropically and with a great accuracy, the dielectric layer on the top and the faces of a 3D structure, while avoiding damaging this 3D structure and without laterally etching the dielectric layer extending into planes parallel to the favoured direction of the anisotropic etching. Typically, the etching is such that the stopping can be controlled on the silicon layer at an atomic scale.

According to another embodiment, each sequence comprises, before said main oxidation:
a prior etching of the dielectric layer (40), anisotropic, by plasma, by using a chemistry comprising at least:
  one fluorocarbon chemistry comprising a first compound, the first compound being fluorine (F)-based, and
  one second compound taken from among $Si_wCl_{(2w+2)}$ and $Si_wF_{(2w+2)}$ w, x, y and z being non-zero integers,
  oxygen (O),
  the prior etching being carried out so as to:
  generate an ionic bombardment directed mainly along said favoured direction (Z),
  adjust the quantity of the at least one first compound to consume all the fluorine-based compound during this first etching so as to interrupt the first etching after having consumed at least one portion of the dielectric layer located on the flanks of the structure,
  deposit a first protective oxide layer, of thickness e60, on the surface of portions of the dielectric layer having, projecting over the base plane (XY), a non-zero surface,
  deposit a second protective oxide layer, of thickness e70, on the surface of said face, the thickness e70 being greater than the thickness e60, due to a composition difference of the first protective oxide layer and of the second protective oxide layer,
said main anisotropic etching being carried out so as to:
  fully etch the first protective oxide layer,
  be stopped before fully etching the whole thickness e70a of the second protective oxide layer, or at the very least, before etching said structure made of a semi-conductive material located under the second protective oxide layer.

Thus, at each sequence, the main anisotropic etching is carried out, so as to:
etch:
  said second first portion of the oxide film, and
  fully etch the first protective oxide layer.
  This makes it possible to reach the portions of the dielectric layer located under the second portion and to each at least one portion of the dielectric layer located on the flanks;
be stopped before etching:
  fully the second protective oxide layer, or at the very least before etching said structure made of a semi-conductive material located under, i.e. to the right of (along the favoured direction) the second protective oxide layer, this makes it possible to prevent any involuntary consumption of said structure made of a semi-conductive material.
  the whole thickness of the first portion of the oxide film, said thickness being measured along a direction parallel to the base plane (XY).
  This makes it possible to avoid laterally consuming the dielectric layer covering the flanks.

Thus, the present invention proposes an effective solution for very anisotropically etching and with great accuracy, the dielectric layer on the top and the faces of a 3D structure, while avoiding damaging this 3D structure and without laterally etching the dielectric layer extending into planes parallel to the favoured direction of the anisotropic etching. Typically, the etching is such that the stopping can be controlled on the silicon layer at an atomic scale.

Indeed, the chemistry used during the prior etching, combining fluorinated types and at least one silicon-based gas makes it possible to effectively etch the dielectric layer, with a high selectivity with respect to the semi-conductive material of the 3D structure. Moreover, this prior etching is interrupted when the whole fluorinated type is consumed, before etching of the semi-conductive material of the 3D structure. The presence of oxygen in the plasma leads to the formation of a protective oxide layer, of which the thickness is greater on the semi-conductive material of the structure, than on the dielectric layer.

The main anisotropic etching, which occurs after the prior etching, makes it possible to remove the protective oxide layer on the dielectric layer, while conserving this protective oxide layer on the semi-conductive material. During the prior etching of the following sequence, the semi-conductive material will therefore be protected by the residue of the protective oxide layer which will limit the etching of the latter, while the dielectric layer will no longer be protected by the protective oxide layer. The dielectric layer, stripped, will therefore be etched easily.

By repeating this sequence of steps, the dielectric layer is thus etched rapidly, while consuming hardly any at all, even without consuming the semi-conductive material of the 3D structure.

Moreover, the oxide film formed on the surface of the dielectric layer covering the flanks prevents any lateral consumption of the latter. The dielectric layer covering the surfaces perpendicular to the base plane XY is therefore etched perfectly anisotropically, i.e. along the favoured direction Z. The dimensional control of the thickness of the dielectric layer is therefore considerably improved.

When the 3D structure is intended to form a FinFET-type transistor, the present invention thus proposes an effective solution for etching the dielectric layer deposited on the Fins, while avoiding, even by removing, the dielectric layer residue outside of the Fins, as well as the consumption of layers underlying the dielectric layer such that the semi-conductive layer forming the Fin.

Moreover, the oxide film formed on the surface of the dielectric layer furthermore makes it possible to preserve the dimensional control of the spacers covering the flanks of the gate.

According to an example, said first fluorine (F)-based compound of the chemistry used for the prior etching step originates, preferably fully, from the chemistry used during said initial etching step.

According to an example, the initial etching step is interrupted so as to conserve a portion of the dielectric layer located on said face of the structure made of a semi-conductive material, the initial etching step being based on a fluorocarbon chemistry.

According to an example, the main anisotropic etching is a fluorocarbon chemistry-based etching.

Before the main oxidation, and preferably after the prior oxidation when the latter is carried out, the dielectric layer covers the flanks of said structure and at least one portion of the face of said structure is not covered by the dielectric layer. Preferably, this portion is uncovered. It is thus accessible to be oxidised during the main oxidation.

According to an embodiment, the dielectric layer is formed of one of the following materials: SiCO, SiC, SiCN, SiOCN or SiCBN, or a silicon nitride (SixNy, x and y being non-zero integers). Typically, it is formed of $Si_3N_4$. It can also be any other so-called low-k material (i.e. material with low dielectric constant), of which the dielectric constant is less than 7.

Preferably, all the steps of this embodiment are carried out in the same reactor.

This embodiment, wherein each sequence includes a prior etching, can comprise at least any one of the features and steps mentioned above, taken separately or in combination:

Preferably, the deposition of said dielectric layer is a conform deposition.

According to an embodiment example, the method comprises the initial etching step, carried out before said sequence of steps. This initial etching step is interrupted so as to conserve a portion of the dielectric layer located on the top of the structure made of a semi-conductive material.

According to an embodiment example, the initial etching step of the dielectric layer is based on a fluorocarbon chemistry (for example, $C_xF_y$ or $C_xH_yF_z$).

According to an embodiment example, the initial etching step is interrupted by controlling the etching time, such that the thickness $e_{11}$ etched of the dielectric layer during this initial etching step is such that $0.7 \times e_{10} \geq e_{11} \geq 0.95 \times e_{10}$, $e_{10}$ being the thickness of the dielectric layer before etching by said initial etching step.

Thus, this initial etching step makes it possible to etch a significant portion of the dielectric layer. It makes it possible to increase the rapidity of the method.

According to an embodiment example, $e_{10} \geq 6$ nm and preferably $e_{10} \geq 8$ nm.

According to an embodiment example, said portion of the dielectric layer conserved from the initial etching has a thickness $e_{12}$ greater than or equal to 2 nm ($2 \cdot 10^{-9}$ metres) and preferably of between 2 and 5 nm, with $e_2 = e_{10} - e_{11}$.

This step thus makes it possible to remove some of the thickness of the dielectric layer by ensuring that the structure made of a semi-conductive material is not etched or altered.

According to an embodiment example, said first fluoride (F)-based compound of the chemistry used for the prior etching step originates, preferably fully, from the chemistry used during said prior etching step.

Alternatively, at least some and optionally the whole first fluorine (F)-based compound of the chemistry used for the prior etching step is provided during the prior etching step.

According to an embodiment example, the first fluorine (F)-based compound originates from the separation of at least one compound taken from among fluorocarbon compounds (for example, $C_xF_z$ or $C_xH_yF_z$).

According to an embodiment example, the main anisotropic etching is an etching on the basis of a fluorinated or fluorocarbon chemistry (for example, $C_xF_z$ or $C_xH_yF_z$).

According to an embodiment example, the main anisotropic etching is time-controlled, so as to fully remove the first protective oxide layer and to conserve some $e_{70b}$ of the thickness $e_{70a}$ of the second protective oxide layer.

Thus, during a subsequent etching, the top of the substrate remains protected by the second protective oxide layer, while the top of the nitride layer located on the flank is itself not protected. The latter can thus be easily etched along the favoured direction.

Each of the embodiments proposed above can also comprise at least any one of the features and steps mentioned below, taken individually or in combination:

According to an embodiment example, said structure is three-dimensional (3D).

According to an embodiment example, the structure made of a semi-conductive material is made of a material taken from among the following materials: silicon (Si), germanium (Ge), silicon-germanium (SiGe).

The structure is made of a semi-conductive material can also be formed of a succession of semi-conductive layers. It can, for example, be formed of a succession of Si and SiGe layers. It can, for example, be the case in the scope of the embodiment of nanowires.

According to an embodiment, the structure surmounts a substrate which extends parallel to the base plane.

According to an embodiment example, the structure made of a semi-conductive material forms a channel of a FinFET transistor.

According to an embodiment, the face forms a top for the Fins of a FinFET-type transistor.

According to an embodiment, said face is flat and extends parallel to the base plane.

According to an embodiment example, said structure is formed by at least one block or one semi-conductive material strip. Alternatively, said structure is formed by a possibly conform layer, having a three-dimensional form.

According to an embodiment example, the top extends mainly in a plane parallel to the plane (XY) of the support substrate.

According to an embodiment example, said structure comprises first surfaces which are perpendicular to the support substrate plane and second surfaces which are not perpendicular to said support substrate plane.

According to an embodiment example, the flanks of the structure are perpendicular to the plane XY, wherein extends mainly the support substrate. Alternatively, the flanks of the structure are inclined with respect to a direction Z perpendicular to the plane XY, wherein extends mainly the support substrate.

According to an embodiment example, the dielectric layer is directly in contact with the structure made of a semi-conductive material.

According to an embodiment example, when the dielectric layer located on the flank of the structure is fully etched, then a step of removing the second protective oxide layer is carried out.

In the scope of the present invention, when it is indicated that the etching of a layer A is stopped before consuming or etching a layer B located under the layer A, this means that the layer B is not at all consumed or that, due to the inevitable inaccuracies of the methods, the layer B is involuntarily consumed on a very low thickness, typically a thickness less than 1.5 nm, and preferably a thickness less than nm, and preferably a thickness not exceeding more than three atomic layers of the layer B. These thicknesses are measured along the favoured direction of the anisotropic etching of the layer A.

It is specified that, in the scope of the present invention, the terms "on", "surmounts", "covers", "underlying", "opposite" and the equivalents thereof do not necessarily mean "in contact with". Thus, for example, the deposition, of a first layer on a second layer, does not compulsorily mean that the two layers are directly in contact with one another, but means that the first layer covers at least partially the second layer by being, either directly in contact with it, or by being separated from it by at least one other layer or at least one other element.

A layer can moreover be composed of several sublayers of one same material or different materials.

By a material A-"based" substrate, film, or layer, this means a substrate, a film, or a layer comprising this material A only, or this material A and possibly other materials, for example doping elements.

In the scope of the present invention, a fluorocarbon chemistry is a chemistry comprising fluorine (F) and carbon (C). The composition thereof is, for example, one of the following compositions: $C_xF_z$, $C_xH_yF_z$, etc.

The word "dielectric" qualifies a material of which the electrical conductivity is sufficiently low in the given application to be used as an insulator.

The term "step" does not compulsorily mean that the actions taken during a step are simultaneous or immediately successive. Certain actions of a first step can, in particular, be followed by actions linked to a different step, and other actions of the first step can then be repeated. Thus, the term "step" does not necessarily mean single and inseparable actions over time and in the chain of the phases of the method.

By "nature", this means a material, the chemical composition thereof and/or the crystalline structure thereof. Thus, two layers can be of the same chemical composition, but of a different nature from a crystallographic standpoint.

It is specified that in the scope of the present invention, the thickness of a layer or of the substrate is measured along a direction perpendicular to the surface according to which this layer or this substrate has the maximum extension thereof.

Except for any indication on the contrary, in the figures, the thickness is taken along the vertical, i.e. along the axis Z.

Likewise, when it is indicated that an element is located to the right of another element, this means that these two elements are both located on one same line perpendicular to the main plane of the substrate, that is on one same line oriented vertically in the figures.

In the scope of the present invention, by three-dimensional structure, this means a structure forming a protrusion above a layer which itself is underlying, such as a support substrate or a structure having a profile having at least two discrete levels of height or which have a similar profile with a continuous variation of tangents of the form of the profile.

In the scope of the present invention, a non-limiting but particularly advantageous example of a 3D structure is a strip (also called a Fin) forming the extension of a FinFET transistor channel.

In reference to FIGS. 3A to 3G and to FIG. 4, a non-limiting example of the invention will now be described.

In these figures, the dielectric layer 40 that is sought to be etched surmounts a three-dimensional structure formed by the Fin 30 of a FinFET transistor 100. All the features, steps and technical advantages which will be described below are also applied to embodiments wherein the dielectric layer 40 surmounts a structure 30 different from a Fin of a FinFET transistor 100.

Figure 3A:
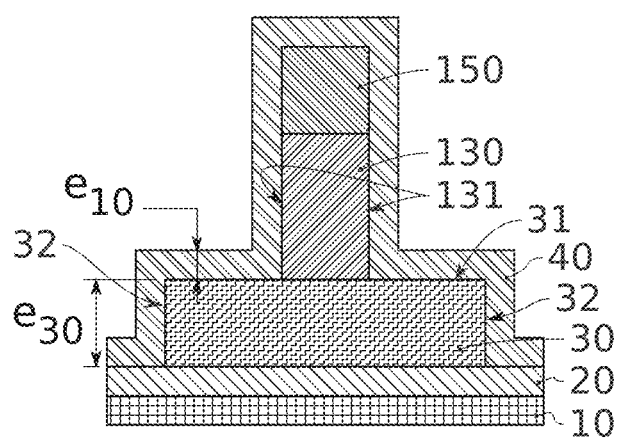
FIG. 3, composed of FIGS. 3A to 3G, schematically illustrates steps of a method according to a first non-limiting embodiment of the present invention.

FIG. 3A illustrates a FinFET transistor 100 under development. This structure comprises a support substrate 10, surmounted by an insulator layer 20, typically a buried oxide layer BOX and a thin semi-conductive layer. This assembly preferably forms a developed substrate, preferably of on insulator semi-conductive type.

According to another embodiment covered by the present invention, FinFET transistors are manufactured on bulk substrates. In this case, the Fin 30 extends vertically (along the axis Z) to the bulk substrate, typically silicon. The gate pattern itself rests on a dielectric layer.

The structure 30 also comprises a pattern which extends from the structure 30. According to a non-limiting example, this pattern is a gate patter 130. According to an embodiment, it can be a gate stack, which will be designated below by the term "gate" for reasons of conciseness. This gate pattern 130 in particular comprises a portion usually made of doped silicon or metal, a metal layer and an electrically insulating layer called gate oxide located between the active layer and the gate made of polycrystalline silicon. The gate stack can also comprise a dielectric layer called "high-k", i.e. made of a material with high permittivity. When it is present, this dielectric layer is located between the gate oxide and the metal gate. For reasons of clarity, in FIG. 3A, one single block represents the assembly of this stack forming the gate 130. A hard mask 150 surmounts the gate 130. The hard mask 150 can be formed of one single layer or a stack of different materials. The gate 130 extends mainly in the plane ZX of the orthogonal marker XYZ referenced in FIG. 3A.

A patter passes through the gate 130 on either side, along the axis Y. This pattern generally has a Fin form. It is designated Fin 30. It forms the channel of the transistor, as well as extensions, located on either side of the gate 130, and which are intended to form source and drain zones. This pattern has flanks 32 and an upper face 31, also called top 31. The flanks 32 preferably extend into a plane YZ, perpendicular to the plane XY wherein the support substrate 10 mainly extends. In this example, and without this being limiting, the upper face 31 extends into a plane parallel to the plane XY. Thus, the semi-conductive pattern forms a three-dimensional structure 30. It forms a protrusion on the upper face of the stack of layers comprising the support substrate 10 and the insulating layer 20.

In this example, the structure 30 is made of a semi-conductive material, typically taken from among silicon, silicon-germanium and germanium. This structure can also be formed by a stack of semi-conductive layers, for example an alternance of Si and SiGe layers.

In the figures, the gate, the channel and the Fins are illustrated by a homogenous material. However, the invention also covers the case where one or more of these elements are formed of a stack of layers such as a stack of nanowires, forming for example, an Si/SiGe alternance.

FIG. 3A is a cross-sectional view along a plane parallel to the plane ZX is taken at the level of a Fin 30.

The height $e_{30}$ of the Fin 30 is referenced in this FIG. 3A. For example, the height $e_{30}$ of the Fin, measured along the direction Z, is of between a few nanometres and a few tens of nanometres. Preferably, $e_{30}$ is of between 10 and 200 nanometres and also more preferably, $e_{30}$ is of between 30 and 150 nm.

As illustrated in FIG. 3A, a dielectric layer 40 covers all of the transistor under development. Preferably, this dielectric layer 40 is a conform layer.

In this example linked to FinFET transistors, this dielectric layer 40 is intended to form spacers 140 on the flanks of the gate 130. This dielectric layer 40 is thus formed in materials having a low dielectric constant. This dielectric layer 40 can be porous or not.

In the embodiment illustrated in reference to FIGS. 3A to 3G, the dielectric layer 40 is $Si_xN_y$, x and y being non-zero integers, typically SiN or $Si_3N_4$.

Once deposited, this dielectric layer 40 has, for example, a thickness $e_{10}$ of between 4 and 50 nanometres preferably, between 4 and 30 nanometres and preferably between 8 and 12 nanometres. The thickness $e_{10}$ is measured along the direction Z. It is referenced in FIG. 3A.

This dielectric layer 40 is, for example, formed by one of the following techniques: plasma enhanced chemical vapour deposition (PECVD), low pressure CVD (LPCVD), plasma enhanced atomic layer deposition (PEALD).

From the structure illustrated in FIG. 3A, several steps will be implemented with the aim of fully removing the dielectric layer 40 on the upper face 31 and on the flanks 32 of the structure 30 forming the Fin, as well as on either side of the flanks 32 of the Fin 30, this:
without leaving dielectric layer residue on the Fin 30,
without damaging the underlying layers, which are the Fin 30 and the insulating layer 20,
without laterally consuming the dielectric layer 40 covering the flanks 131 of the gate 130.

Figure 3B:
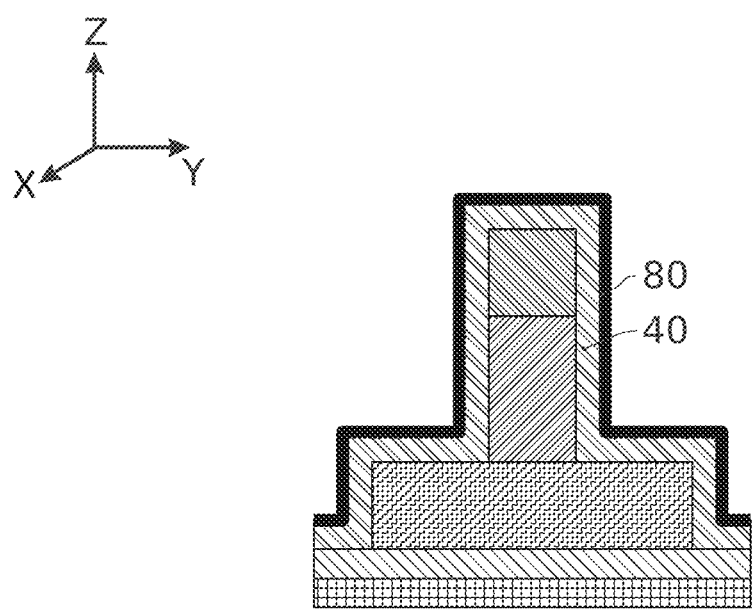

FIG. 3B illustrates a first step. This step is optional, but advantageous. Indeed, it makes it possible to control the size of the spacer from the start of the method.

During this step, an oxidation of the whole dielectric layer 40 is carried out, so as to form an oxide film designated initial oxide film 80. For reasons of clarity, this initial oxide film is represented exaggeratingly thick in FIG. 3B.

The composition of this initial oxide film 80 is typically on the basis of or is $Si_xO_yN_z$, x, y, z being non-zero integers. As will be indicated below, this initial oxide film 80 present for an interest to form a protective film to limit the lateral consumption of the dielectric layer 40 during the subsequent anisotropic etching step.

This initial oxidation step is preferably carried out in etching equipment such as a plasma etching reactor. Preferably, the reactor is an inductive coupling plasma (ICP) reactor. It can also be a capacitive coupling (CCP) reactor. The plasma is formed from an oxygen-based chemistry.

Figure 3C:
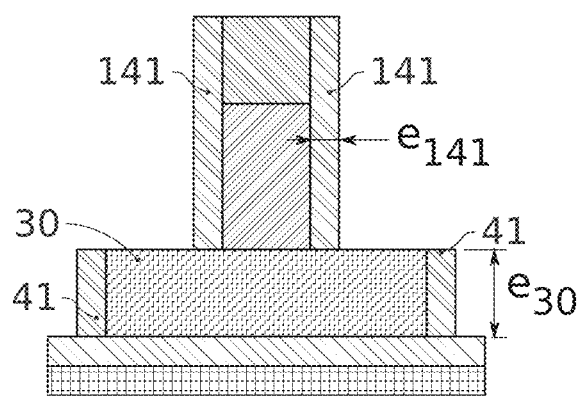

FIG. 3C illustrates an initial etching step of the dielectric layer 40. This etching is anisotropic and has a favoured direction along the axis Z perpendicular to the base plane XY wherein the structure 30 extends, and more generally, the transistor. This anisotropic etching, designated below as initial etching, is carried out so as to:
remove, preferably fully, the dielectric layer 40 surmounting the structure 30 forming the Fin,
conserve the dielectric layer 40 located on the flanks 32 of the structure 30 and on the flanks 131 of the gate 130.

During this step, it is unrealistic to prevent a lateral consumption, even low of the layers in presence. Thus, the initial oxide film 80 is inevitably consumed during this initial etching step. However, the chemistry used to etch the dielectric layer 40, etches the latter more rapidly than the initial oxide film 80.

Thus, the initial oxide film 80 thus perfectly plays its role of a protective film in order to prevent the lateral consumption (i.e. along a direction perpendicular to the favoured direction Z) of the portions 41, 141 of dielectric layer 40 located on the perpendicular walls, i.e. on the flanks 32, 131 of the structure 30 and of the gate 130.

Thus, during the initial etching step, the dimensional control of the dielectric layer 40 located on the flanks 131 of the gate 130 is conserved.

Naturally, the parameters of the initial oxidation will be adapted, in particular the thickness of the initial oxide film 80, as well as the time of the initial etching so as to fully remove the dielectric layer 40 located on the top of the structure 30 without starting to laterally consume the dielectric layer 40 portions 141 located on the flanks 131 of the gate 130.

However, it can be provided that from the initial etching step, and as is illustrated in FIG. 3C, the whole thickness of the initial oxide film 80 is consumed.

The method making it possible to remove the dielectric layer 40 anisotropically on the flanks 32, 131 of the vertical walls without consuming this layer laterally, comprises a sequence of steps, this sequence being repeated until the removal of the whole height sought of the dielectric layer.

Figure 3D:
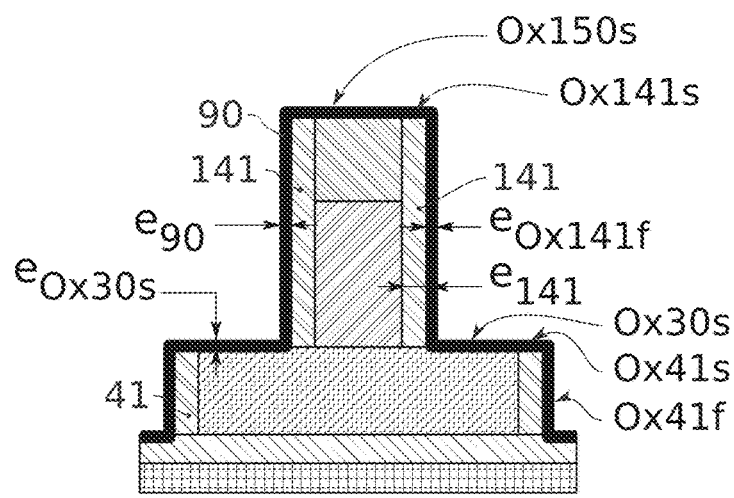
Figure 3E:
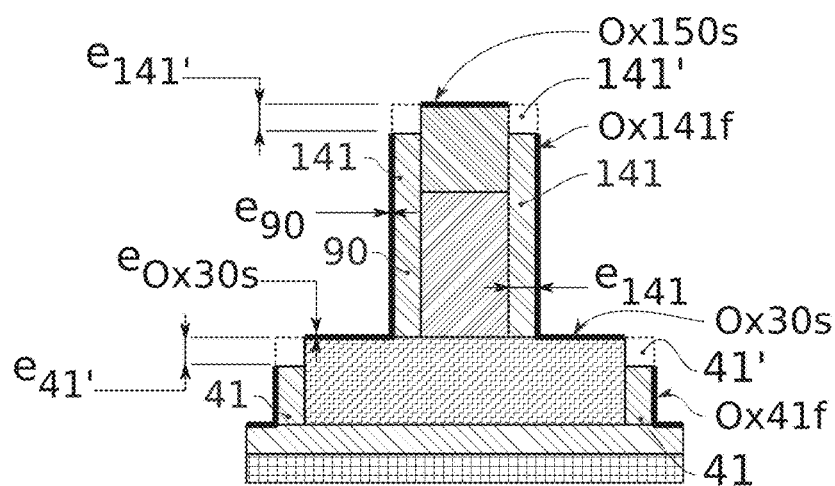

A first sequence of steps is illustrated in reference to FIGS. 3D and 3E. This sequence can be repeated until obtaining the result which is illustrated in FIG. 3G.

FIG. 3D illustrates an oxidation step, designated below as main oxidation. This oxide film 90 covers the whole uncovered surface. It is formed by oxidation of the uncovered surfaces. This oxide film 90 therefore has different compositions according to the nature of the oxidised surfaces. In the figures, to facilitate the understanding of the invention, the oxide film 90 is represented as exaggeratingly thick.

Thus, this oxide film 90 has:
at least one first portion Ox41*f*, Ox141*f* formed on the surface of the dielectric layer 40 and extending into a plane perpendicular YZ, ZX to the base plane XY. Typically, the first portions Ox41*f*, Ox141*f* are formed by oxidation of the dielectric layer covering the flanks 32,131 of the structure 30 and of the gate 130.
at least second portions Ox41*s*, Ox141*s*, also formed on the dielectric layer 40. These second portions have, projecting over the base plane XY, i.e. orthogonally projecting, therefore along a perpendicular direction Z, over the base plane XY, a non-zero surface. Typically, the second portions Ox41*s*, Ox141*s* are formed by oxidation of the thickness of the dielectric layer 40 covering the walls perpendicular to the base plane XY.

at least one third portion Ox30s formed on said face 31 and having, projecting along a direction perpendicular Z to the base plane XY, a non-zero surface. Typically, the at least one third portion Ox30s is formed by oxidation of the uncovered surface of the structure 30 made of semi-conductive material.

As emerges from the preceding paragraphs, a projection along a direction perpendicular Z to the base plane XY, corresponds to a projection over the base plane XY along the perpendicular direction Z. Thus, this is an orthogonal projection over this plane. The projection, over the base plane XY, of a face perpendicular to the plane XY, corresponds to a line or a curve. The surface thereof is zero. On the contrary, if the projection over the base plane XY of a face, has a non-zero surface, thus this face is not perpendicular to the base plane XY. This face is thus inclined with respect to a direction Z perpendicular to the base plane XY. This face is, for example, parallel to the base plane XY.

It will also be noted that the oxide film 90 can have a portion Ox150s formed by oxidation of the hard mask 150 covering the gate 130.

The composition of the two portions Ox41s, Ox141s is different from the composition of the three portions Ox30s.

Typically, if the dielectric layer 40 is made of $Si_xN_y$, and the Si-bases structure 30, thus the second oxide film Ox41s, Ox141s can be $Si_xO_yN_z$ and the third portion Ox30s of the oxide film 90 can be $Si_xO_y$, x, y, z, being non-zero integers.

As will be seen below, due to the different composition thereof, these portions of the oxide film 90 have different sensitivities to the etching of the following step.

Typically, the thickness of the oxide film 90 is of between 2 and 4 nanometres. This thickness can differ from one portion to the other.

It will be noted that according to the parameters of the main oxidation step, in particular with a zero, even very low bias voltage (typically less than 50V or 30V), the thickness $e_{Ox141f}$ is equal to the thickness $e_{Ox30s}$. These thicknesses $e_{Ox141f}$ and $e_{Ox30s}$, are referenced in FIG. 3D.

This main oxidation step is preferably carried out in etching equipment such as a plasma etching reactor. Preferably, the reactor is an ICP or CCP reactor. Preferably, this main oxidation step is carried out in the same reactor as the preceding steps.

The plasma enabling the oxidation is formed from an oxygen-based chemistry.

Preferably, the bias voltage is zero or very low in order to avoid damaging the semi-conductive material of the structure 30. More generally, the bias voltage is less than 50V and preferably less than 30V.

The duration of the oxidation is preferably of between 5 and 30 seconds and preferably of between 10 and 20 seconds.

FIG. 3E illustrates an anisotropic etching step, designated below as main anisotropic etching. This anisotropic etching has a favoured direction Z, perpendicular to the base plane XY.

This main anisotropic etching is configured so as to etch the two first portions Ox41s, Ox141s, so as to uncover then to etch, along the favoured direction Z, at least one portion of the dielectric layer 40 located just under, along the favoured direction Z, of the second portion Ox41s, Ox141s. The portions of dielectric layer 40 which are consumed vertically are referenced 41', 141' in FIG. 3E. The thickness consumed, measured along the direction Z, is referenced $e_{41''}$.

Due to the different compositions thereof, the second portions Ox41s, Ox141s are more sensitive to etching than the third portions Ox30s. This is explained by the fact that silicon is oxidised more easily than nitride. The oxygen quantity of the oxide film protecting the Si is therefore greater than the quantity of the oxide film covering the SiN. The oxide film covering the SiN is therefore etched more rapidly than the oxide film covering the Si.

The thickness of the oxide film 90 is adjusted such that, when the thickness $e_{Ox141s}$ is fully consumed, it subsists a thickness $e_{Ox30s}$ on the face 31 of the structure 30. It is thus possible to etch the dielectric layer 41, 141 stripped without consuming the dielectric material of the structure 30.

FIG. 3E illustrates the disappearance of the portions Ox41s and Ox141s and the tapering of the portions Ox141f and Ox30s caused by the main anisotropic etching.

In FIG. 3E, a portion of the oxide film Ox150s has been illustrated, which covers the hard mask 150. It is actually the case if the hard mask 150, or at the very least, the upper face thereof, is made of an oxide. However, if this upper face is made of a nitride, thus the portion of the oxide film Ox150s is easily etched and this oxide film portion Ox150s will have disappeared at the end of the main anisotropic etching step.

Although it is preferable to stop the main anisotropic etching, before etching the structure 30 made of a semi-conductive material, it remains naturally possible to consume a very low thickness of the structure 30 made of semi-conductive material, in order to ensure that no oxide film residue remains on the structure 30. Typically, this consumed thickness of the structure 30 made of semi-conductive material is less than or equal to 1 nm and preferably less than or equal to three atomic layers of the structure 30.

Preferably, this main anisotropic etching is also stopped before consuming all the thickness $e_{ox141f}$ of the first portion of the oxide film Ox41f, Ox141f or at the very least, before starting laterally consuming the dielectric layer 41, 141 arranged on the flanks 32, 131 of the walls perpendicular to the base plane XY. Thus, during this main anisotropic etching step, the dimensional control of the portions 141 intended to form the gate spacers 130 is conserved.

It will also be noted that the oxide film 90 covers and protects the insulating layer 20 during the main anisotropic etching step.

Thus, from this first sequence of steps, a portion 41', 141' of the dielectric layer 40 arranged on the walls parallel to the favoured etching direction Z has been vertically consumed. Furthermore, these portions 41, 141 of dielectric layer 40 arranged on the walls parallel to the favoured direction Z are not laterally consumed. They therefore conserve the initial thickness $e_{141}$ thereof. Therefore, the dimensional control of the portions 141 of dielectric layer intended to form the spacers 140 is conserved. Moreover, the semi-conductive structure 30 is not consumed nor even altered by the etching.

This main anisotropic etching is preferably carried out in etching equipment such as a plasma etching reactor. Preferably, the reactor is an ICP or CCP reactor. Preferably, this step is carried out in the same reactor as the preceding steps.

The etching plasma is formed from a fluorocarbon chemistry which makes it possible to improve the anisotropy of the etching. According to an example, this chemistry comprises a fluorocarbon type from among the following types $C_xH_yF_z$ or $C_xH_y$, x, y and z being non-zero integers. Preferably, the fluorocarbon chemistry also comprises at least one additional type of dilution or separation such as argon (Ar), helium (He), nitrogen (N) or oxygen (O). This etching chemistry has the advantage of also improving the anisotropy of the etching.

It will be noted that due to the introduction of the fluorinated component during etching, the composition of the conserved oxide films can evolve. Thus, if the structure 30 is Si-based, thus the first portion Ox141f, Ox41f of the oxide film 90 (i.e. the oxide film located on nitride), can be $Si_xO_yN_zC_wF_t$, and the third portion Ox30s of the oxide film 90 (i.e. the oxide film located on silicon) can be $Si_xO_yC_wF_t$, w, x, y, z, t, being non-zero integers and w being possibly equal to 0 as indicated above.

This composition is however not limiting. Indeed, the composition of the oxide film depends on the oxygen and carbon ratio or content in the gaseous mixture used for the main anisotropic etching step.

An increase in the oxygen concentration in the gaseous mixture leads to a reduction in the carbon content in the oxide film. Typically, if the oxygen concentration is greater than 30% in the gaseous mixture, thus this oxidation step will mainly lead to oxidising the uncovered surfaces and the carbon content of the oxide film will be zero or very low.

Thus, according to the radio of different gases and in particular the carbon and oxygen content of the gaseous mixture, from the main anisotropic etching step, the following composition can be observed:

$Si_xO_yN_zC_wF_t$ for the portions Ox141f, Ox41f of the oxide film located on the surface of the layer of the nitride-based material, $Si_xO_yC_wF_z$, for the protective oxide layer portion deposited on a silicon-based material.

With x, y, z and t being integers, and w≥0. Thus, the following compositions $Si_xO_yN_zF_t$ and $Si_xO_yF_z$ can be had for w=0.

Whatever the carbon content, the semi-conductive material is oxidised more easily than the nitride-based material or the dielectric layer. The protective oxide layer thus formed therefore protects the semi-conductive material more effectively than the nitride-based material during the main anisotropic etching.

The plasma can be continuous or pulsed.

The duration of this step is adjusted according to the ratio of the etching speeds of the uncovered layers and of the thickness of the oxide film 90.

The sequence is repeated until the complete removal of the portions 41 of dielectric layer 40 located on the flanks 32 of the structure 30 made of a semi-conductive material.

Figure 3F:
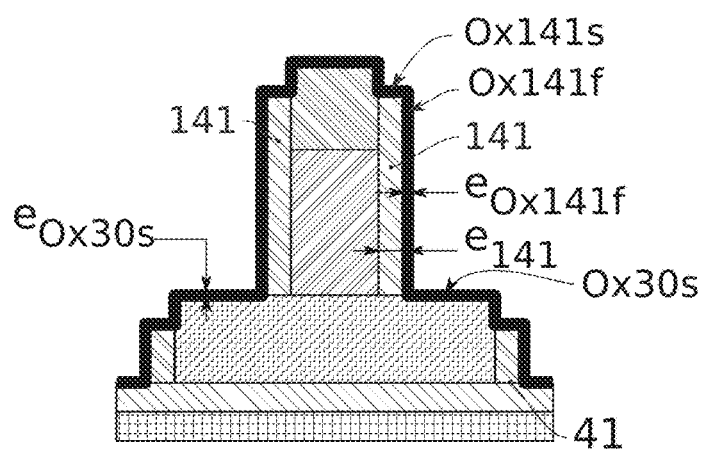
Figure 3G:
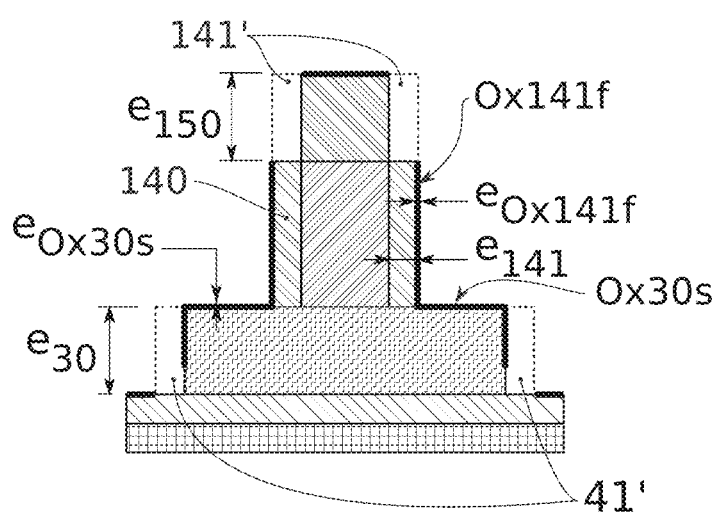

Thus, a second sequence of steps is illustrated in FIGS. 3F and 3G.

FIG. 3F is a main oxidation to reform an oxide film 90 on all the uncovered surfaces.

FIG. 3G is a main anisotropic etching carried out so as to vertically consume the dielectric layer 40, preferably the whole dielectric layer 40.

During this main anisotropic etching:
the first portion Ox141f of the oxide film 90 protects the dielectric layer 40 to avoid the lateral consumption thereof,
the third portion Ox30s of the oxide film 90 protects the structure 30 to avoid the consumption thereof or the alteration thereof.

This sequence is repeated until the complete disappearance of the portions 41 of the protective layer 40 covering the flanks 32 of the structure 30. Thus, the portion 41' of dielectric layer 40 vertically consumed has the same thickness as that $e_{30}$ of the structure 30.

The duration of the sequences typically varies between 5 seconds and 60 seconds. This duration depends on the thickness of the oxide film 90 and therefore the duration of the main oxidation step since the main anisotropic etching must consume, at each cycle, the whole thickness of the first portions Ox41s of the oxide film, as well as a portion 41', 141' of the dielectric layer.

In the case of the production of a FinFET transistor, it is sought to conserve the dielectric layer 40 on the flanks of the gate 130 while fully removing the dielectric layer 40 on the Fins 30. Yet, the flanks 131 of the gate 130 and the flanks 32 of the Fin 30 are generally perpendicular to the main plane XY of the support substrate 10 and are generally parallel to the main direction Z of implanting ions from the plasma. In order to avoid consuming the dielectric layer 40 on the flanks of the gate 130 during the removal of this same layer on the flanks of the Fins 30, it is provided that the thickness $e_{150}$ of the hard mask 150 surmounting the gate 130 is greater than or equal to the thickness $e_{30}$ of the Fin 30. Thus, when the dielectric layer 40 covering the flanks 32 of the Fin 30 will be fully consumed, the dielectric layer 40 will have been consumed on at some of the thickness of the hard mask, but will continue to completely cover the flanks of the gate 130.

Figure 4:
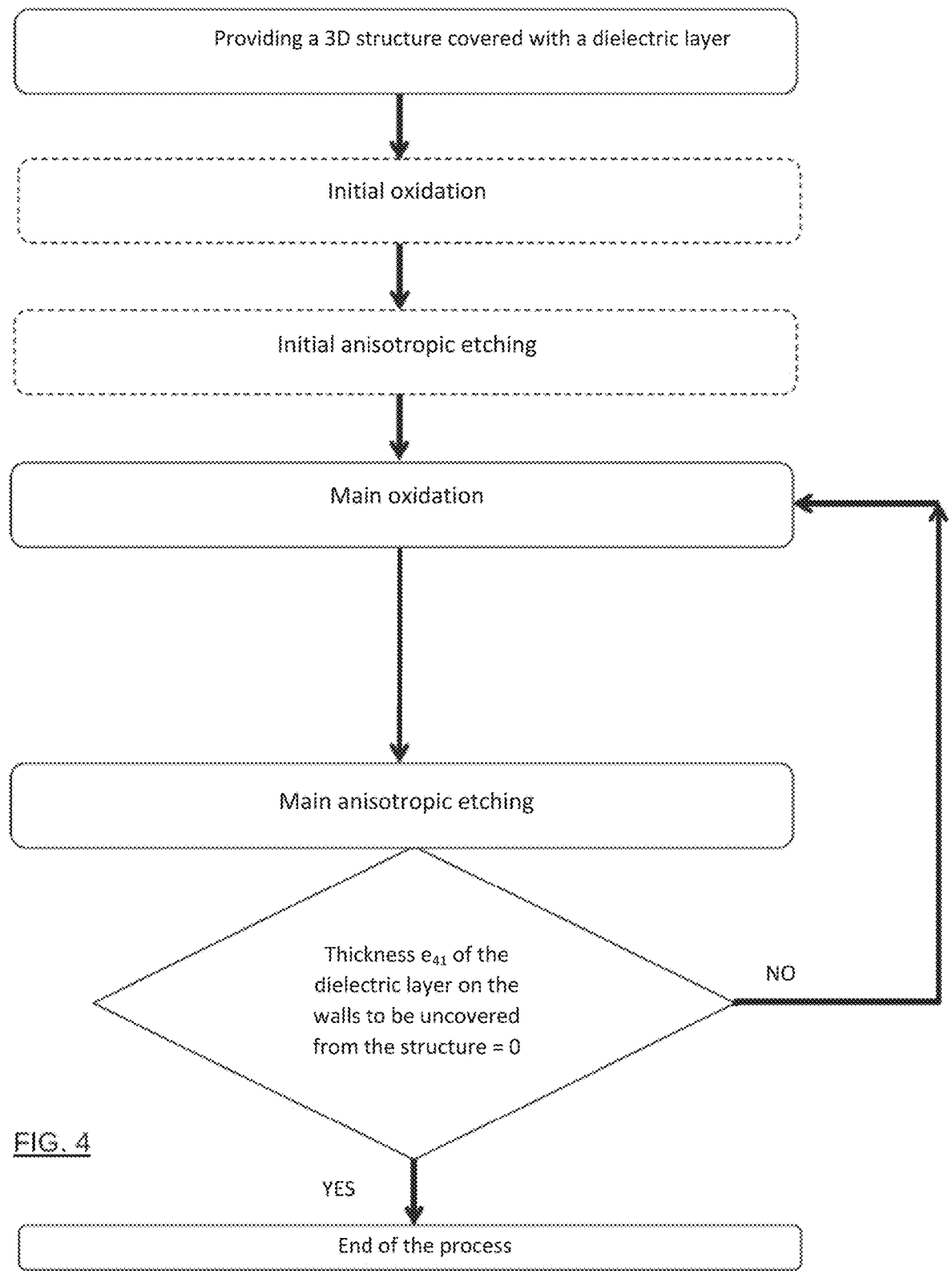
FIG. 4 is a flowchart illustrating some of the steps of the method illustrated in FIG. 3.

FIG. 4 shows, in the form of a flowchart, the main steps of the embodiment illustrated in reference to FIGS. 3A to 3G.

Preferably, all the steps of this embodiment are carried out in the same plasma reactor, which makes it possible to reduce the manufacturing cycles and to reduce the implementation cost of the method.

The tables below give values, optional and non-limiting, of an implementation example of the method illustrated in reference to FIGS. 3A to 3G.

TABLE 1

| Main oxidation (FIGS. 3D and 3F): | |
|---|---|
| Nature of the dielectric layer 40 | SiN |
| Nature of the semi-conductive structure 30 | Si |
| Thickness of the oxide film 90 formed by oxidation | For example, 2 to 4 nm |
| Chemistry: | O2: 200 sccm |
| Plasma type | ICP, CCP, pulsed or continuous |
| Power of the source: | 1000 Watts |
| Bias voltage: | 0 Volts |
| Pressure: | 10 milli Torr |
| Temperature of the support substrate: | For example, 50° C. |
| Time: | 10 seconds |

As indicated above, a zero bias voltage makes it possible to avoid, or at the very least, limit the silicon consumption.

TABLE 2

| Main anisotropic etching (FIGS. 3E and 3G): | |
|---|---|
| Chemistry of the plasma: | CH₂F₂: 95 sccm |
| | O₂: 63 sccm |
| | He: 50 sccm |
| Plasma type | ICP |
| Power of the source: | 400 Watts |
| Bias voltage: | 100 Volts |
| Pressure: | 40 milli Torr |
| Temperature of the support substrate: | 50 °C. |
| Time: | 30 seconds |

The ratio of the flows injected in the reactor relating to the gases $CH_2F_2$ and $O_2$ is selected so as to increase the selectivity of the etching of the SiN with respect to the Si, this in order to limit the Si consumption.

To make this selection, for example this can be based on graphs such as illustrated in FIGS. 7A and 7B.

The graphs of FIG. 7A illustrate, according to the flow of the gas $CH_2F_2$ injected in the reactor, the thicknesses consumed of Si and SiN respectively.

These graphs of FIG. 7A are obtained with the following conditions and by making the flow of $CH_2F_2$ vary.

TABLE 3

| | |
|---|---|
| Chemistry of the plasma: | $CH_2F_2$: variable - see abscissa of the graph |
| | $O_2$: 63 sccm |
| | He: 50 sccm |
| Plasma type | ICP |
| Power of the source: | 400 Watts |
| Bias voltage: | 100 Volts |
| Pressure: | 40 milli Torr |
| Temperature of the support substrate: | For example, 50 °C. |
| Time: | 30 seconds |

The graphs of FIG. 7B illustrate, according to the flow of the gas $O_2$ injected into the reactor, the thicknesses consumed of Si and SiN respectively.

These graphs of FIG. 7B are obtained with the following conditions and by making the flow of O2 vary:

TABLE 4

| | |
|---|---|
| Chemistry of the plasma: | $CH_2F_2$: 95 sccm |
| | $O_2$: variable - see abscissa of the graph |
| | He: 50 sccm |
| Plasma type | ICP |
| Power of the source: | 400 Watts |
| Bias voltage: | 100 Volts |
| Pressure: | 40 milli Torr |
| Temperature of the support substrate: | 50 °C. |
| Time: | 30 seconds |

Regarding these graphs of FIGS. 7A and 7B, it results that the most advantageous conditions are those mentioned in table II above.

Moreover, $CH_4$ can also be added in the chemistry forming the plasma. It has proved to be that this makes it possible to improve the selectivity of the etching of the SiN regarding the Si. For the example mentioned above, a flow of 20 sccm $CH_4$ makes it possible to obtain a particularly increased selectivity.

The duration of the sequences typically varies between 5 seconds and 60 seconds. This duration mainly depends on the duration of the main oxidation step. For example, if the duration of the main oxidation step is 10 seconds, thus the duration of the main anisotropic etching can be 60 seconds.

The embodiment which has been described in detail above, makes it possible to remove with a great accuracy, with a limited number of steps and with a great reliability, the dielectric layer 40 on the structure 30 while conserving the dimensional control of the dielectric layer intended to form the gate spacers.

Another embodiment will now be described in reference to FIGS. 5A to 5L.

Except for being mentioned on the contrary, all the features, steps and advantages mentioned above relative to the embodiments described in reference to FIGS. 3A to 3G are applicable to the embodiments described in reference to FIGS. 5A to 5L.

In this embodiment, the dielectric layer 40 can be porous or not. It is, for example, made of one of the following materials: SiCO, SiC, SiCN, SiOCN or SiCBN, or a silicon nitride ($Si_xN_y$, x and y being non-zero integers), typically SiN.

Figure 5A:
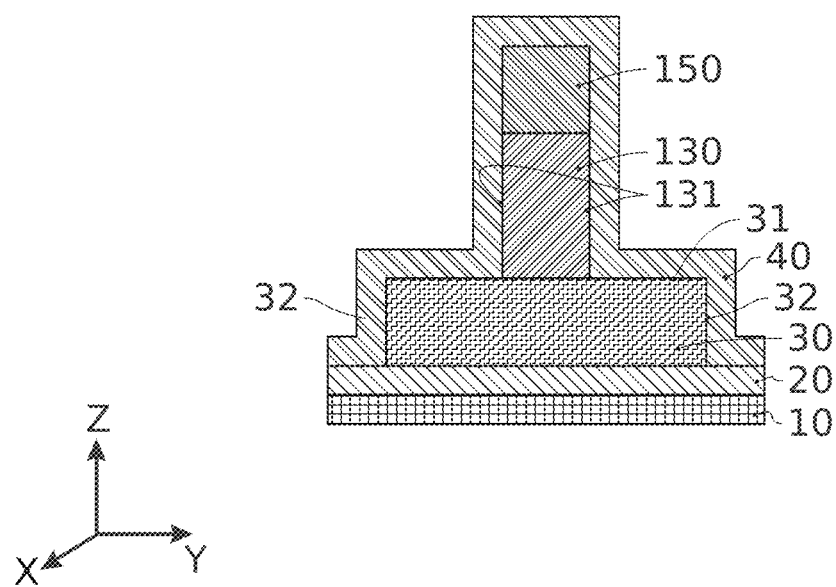
FIG. 5, composed of FIGS. 5A to 5I, schematically illustrates steps of a method according to a second non-limiting embodiment of the present invention.

FIG. 5A is identical to FIG. 3A.

Figure 5B:
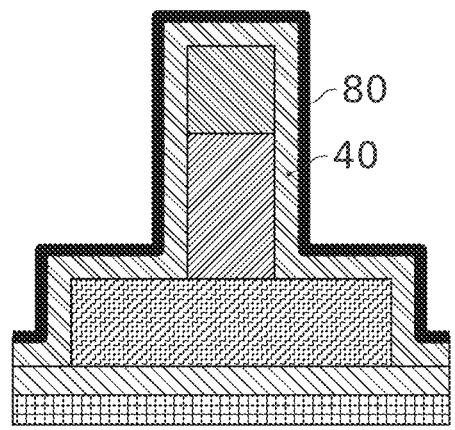

FIG. 5B is identical to FIG. 3B and illustrates the prior optional oxidation step.

All the features mentioned in reference to FIGS. 3A and 3B are fully applicable to the embodiment illustrated in FIGS. 5A to I.

Figure 5C:
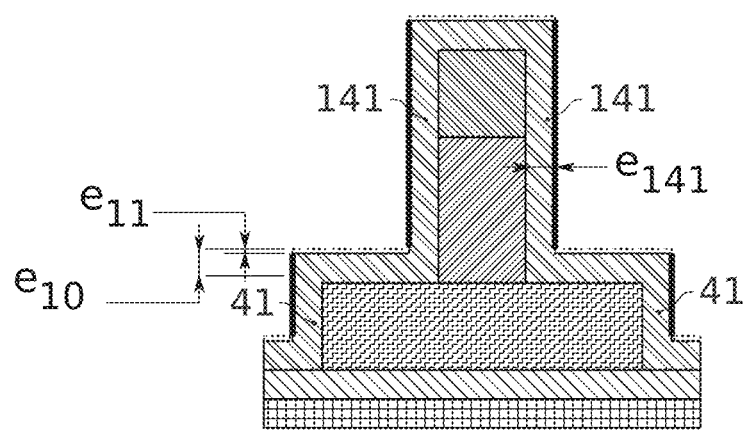

FIG. 5C illustrates the step of initially optionally anisotropically etching the dielectric layer 40. This initial etching step differs from that described in reference to FIG. 3C in that it does not consume the whole thickness $e_{10}$ of the dielectric layer 40 located on the face 31 of the structure 30.

As illustrated in FIG. 5C, this initial anisotropic etching consumes a thickness $e_{11}$ less than $e_{10}$.

Like for the initial etching illustrated in reference to FIG. 3C, in the embodiment illustrated in FIG. 5C, the initial anisotropic etching laterally consumes, inevitably, the initial oxide film 80.

However, this initial anisotropic etching is stopped before the initial oxide film 80 uncovers the portions 141 of the dielectric layer 40 located on the flanks 131 of the gate 30 as is illustrated in FIG. 5C. Alternatively, it can be provided to stop the initial anisotropic etching after lateral consumption of the whole thickness of the initial oxide film 80, but before the consumption of these portions 141 can alter the properties of the spacers.

This initial etching makes it possible to increase the rapidity of the method before subsequent steps which will make it possible for a very accurate etching. Typically, during this prior etching step, more than 70%, and preferably more than 90% and also more preferably, more than 90% of the initial thickness $e_{10}$ of the dielectric layer 40 is etched. The thickness $e_{11}$ removed during this etching is preferably time-controlled. For reasons of clarity, the etched thickness $e_{11}$ illustrated in FIG. 5C is voluntarily represented in a reduced manner.

From the initial anisotropic etching, the upper face 31 of the structure 30, e.g. the top of the Fins in the case of a FinFET transistor, is covered by a residual thickness of the dielectric layer 40. Typically, from the etching, the dielectric layer 40 has a residual thickness greater than 2 nm, preferably greater than 3 nm and preferably greater than 4 nm. Typically, the residual thickness is of between 2 and 3 nm. This residual thickness makes it possible to avoid that during the etching, the layers underlying the dielectric layer 40 are damaged.

This plasma etching step is based on a chemistry comprising a fluorine (F)-based compound. Preferably, this chemistry comprises a fluorocarbon type, for example taken from among the following types $C_xH_yF_z$ or $C_xH_y$, x, y and z being non-zero integers. This etching chemistry has the advantage of improving the anisotropy of the etching. This anisotropy makes it possible to not etch the surfaces which are parallel to the favoured direction of implantation, typically the future spacers of the transistor.

Preferably, the fluorocarbon chemistry also comprises at least one additional dilution or separation type such as argon (Ar), helium (He), nitrogen (N) or oxygen (O).

The plasma can be continuous or pulsed.

Figure 5D:
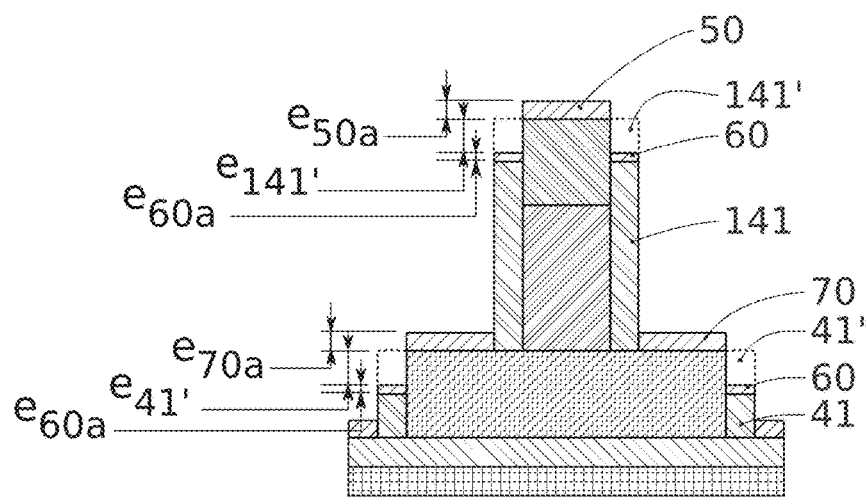
Figure 5E:
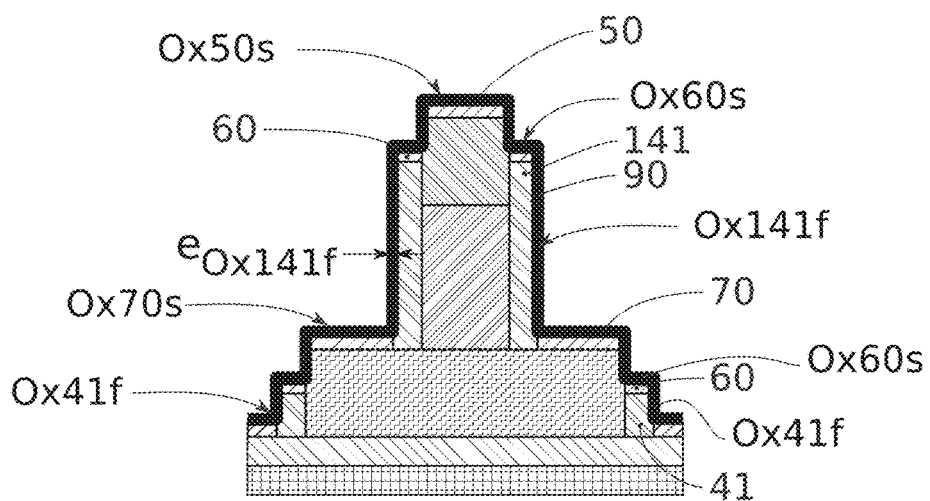
Figure 5F:
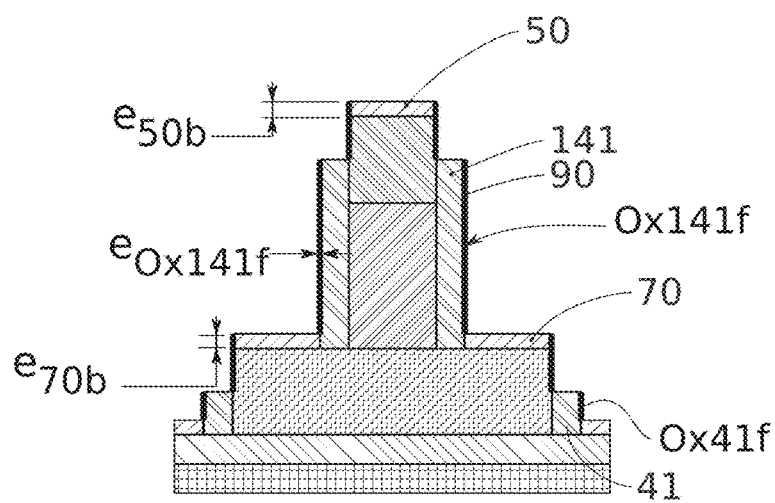
Figure 5G:
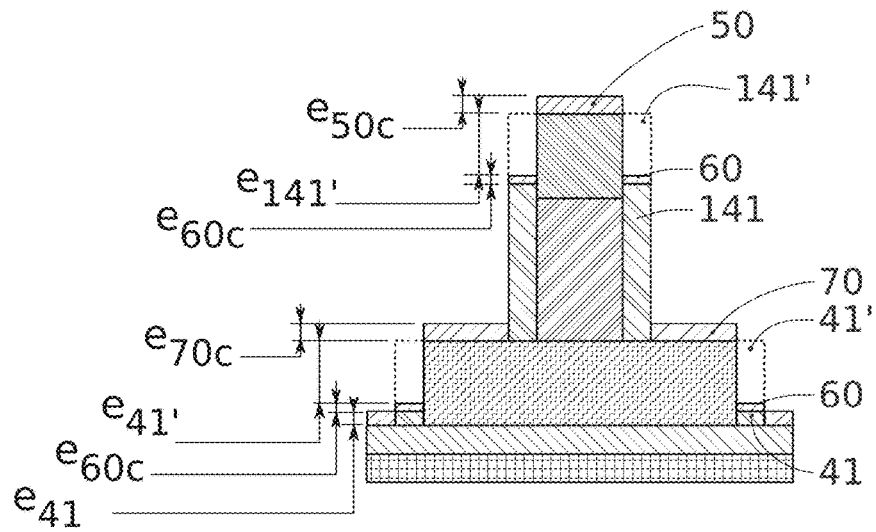
Figure 5H:
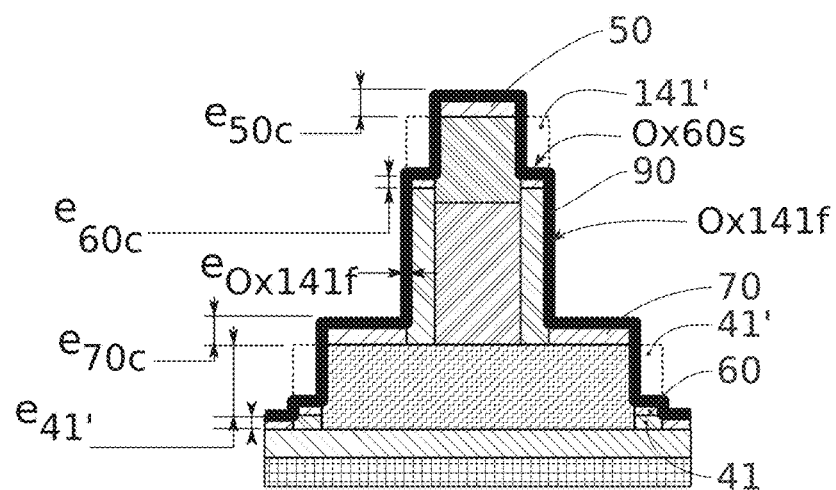
Figure 5I:
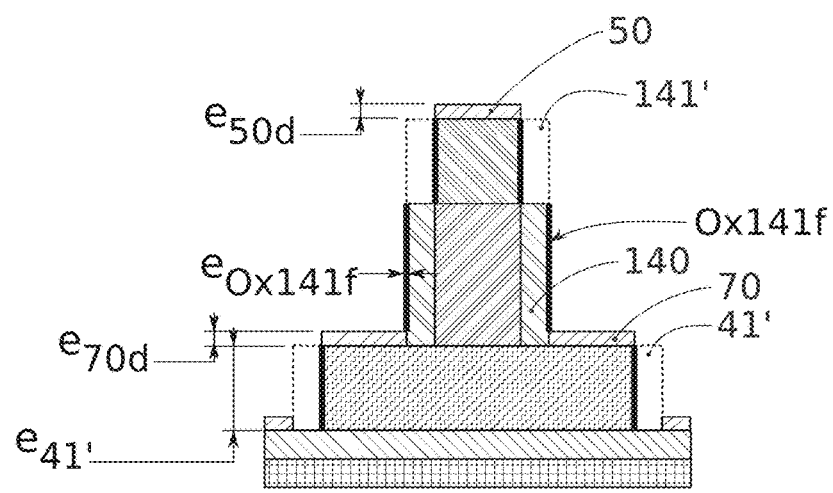

FIGS. 5D to 5F illustrate different steps of a sequence of steps which can be repeated until obtaining the result which is illustrated in FIG. 5I.

The first sequence of steps is carried out from the optional initial etching (FIG. 5C), or after the deposition of the dielectric layer 40 (FIG. 5B), in the case where there is no initial etching.

As illustrated in FIG. 5D, a prior etching of the dielectric layer 40 is carried out.

This prior etching is configured so as to etch the material of the dielectric layer 40, preferably with the material of the structure 30 made of semi-conductive material. Thus, from this prior etching, the etched thickness $e_{41'}$ of the material of the dielectric layer 40 is greater than the etched thickness of the semi-conductive material of the structure 30.

Moreover, this prior etching is configured so as to:
be interrupted before consuming the whole thickness of the dielectric layer 40 located on the flank 32 of the structure 30;
form a first protective oxide layer 60 on an upper portion of the dielectric layer 40 located on the flanks 32 and to form a second protective oxide layer 70 on the top 31 of the structure 30 made of a semi-conductive material, the thickness $e_{60a}$ of the first protective layer 60 being less than the thickness $e_{70a}$ of the second protective layer 70.

These first 60 and second 70 protective layers are formed of oxide depositions. They can thus be qualified as a protective oxide layer. However, these first 60 and second 70 protective layers differ from simple oxidation of the uncovered surfaces.

This prior etching is preferably a plasma etching. It uses a chemistry comprising at least:
one first fluorine (F)-based compound, and
one second compound taken from among $Si_wCl_{(2w+2)}$ and $Si_wF_{(2w+2)}$ w being an integer,
oxygen (O).

The first fluorine-based compound makes it possible for an effective etching of the dielectric layer 40 with a good anisotropy.

The second compound makes it possible to improve the selectivity of the etching of the dielectric layer regarding underlying layers, for example made of a semi-conductive or silicon oxide ($SiO_2$) material.

The quantity of the first fluorine-based compound is adjusted so as to consume all the fluorine-based compounds, and therefore to interrupt the first etching before consuming the whole thickness (taken along the axis Z) of the dielectric layer 40 which is located on the flanks 32. According to a particularly advantageous embodiment, the first fluorine-based compound has been completely introduced during the initial etching illustrated in FIG. 5C. The fluorine subsisting from this prior etching step is used during said first etching until being fully consumed.

Alternatively, some or all of the fluorine-based compounds consumed during this first etching is introduced in the plasma reactor during this first etching.

The presence of oxygen in the chemistry of the plasma makes it possible to oxidise all the stripped surfaces. During the etching, a thick protective oxide layer is formed on the Si, while a thinner layer is formed on the SiN. During the main anisotropic etching step, these two oxide layers will grow and the difference of the thickness thereof also increases.

This oxidation forms protective layers referenced:
60 on the upper portions of the dielectric layer 40 located on the flanks 32 of the Fin 30. This protective layer 60 is, for example, of $Si_xO_yN_zF_t$ type, if the dielectric layer 40 is SiN-based;
70 on the top 31 of the structure 30. This protective layer 70 is, for example, of $Si_xO_yF_z$ type, if the structure 30 is silicon-based.
50 on the top of the hard mask of the surface of the insulating layer 20.

Moreover, if the insulating layer 20 is $Si_xO_y$-based, this oxide deposition can form on the latter, a protective oxide layer 70 made of $Si_xO_yF_z$.

The semi-conductive material of the structure 30 is more reactive to oxygen than the material of the dielectric layer 40, typically a nitride. It ensues, that the thickness $e_{70}$ of the protective layer 70 formed on the top 31 of the structure 30 is greater than the thickness $e_{60}$ formed on the upper portion of the dielectric layer 40 located on the flanks 32 of this structure 30.

Thus, the second protective layer 70 has a thickness $e_{70}$ greater than that $e_{60}$ of the first protective layer 60. Typically, $e_{70} \geq k1 \cdot e_{60}$, with k1=1.5 and preferably k1=2 and preferably k1=3.

Advantageously, the protective layer formed on the surface of the insulating layer 20 has a thickness greater than that $e_{80}$ of the protective layer 60 located on the dielectric layer 40.

Preferably, the chemistry used for this first etching also comprises dilution or separation types, such as argon, helium or nitrogen.

Plasma can be continuous or pulsed. Generally, the pulsed plasma makes it possible to limit the damage of the semi-conductive material of the structure 30.

For example, during this etching, a chemistry comprising the following is used for the plasma:
$C_yH_yF_z$, for example $CH_3F$,
$SiCl_4$ of which the flow is of between 2 and 15 and preferably of around 5 sccm,
oxygen,
possibly, a separation gas such as Ar, He or $N_2$.

FIG. 5E illustrates an oxidation step for forming an oxide film 90 covering all of the uncovered surfaces. This oxidation step corresponds to the main oxidation described in reference to FIG. 3D.

Thus, this oxide film 90 is formed by oxidation of the uncovered surfaces. This oxide film 90 therefore has different compositions according to the nature of the oxidised surfaces. Like for FIG. 3D, the oxide film 90 is represented exaggeratingly thick to facilitate the explanation of the invention.

Thus, this oxide film 90 has:
at least one first portion Ox41f, Ox141f formed on the surface of the dielectric layer 40 and extending into a plane perpendicular YZ, ZX to the base plane XY. Typically, the first portions Ox41f, Ox141f are formed by oxidation of the dielectric layer covering the flanks 32, 131 of the structure 30 and of the gate 130.
at least one second portion Ox60s formed on the surface of the protective oxide layer 60 covering the dielectric layer 40. These second portions have, projecting along a direction perpendicular Z to the base plane XY, a non-zero surface. Typically, the second portions Ox60s are formed by oxidation of the thickness of the protective oxide layer 60 covering the walls perpendicular to the base plane XY.
at least one third portion Ox70s formed by oxidation of the protective oxide layer 70 surmounting the structure 30 made of semi-conductive material. This third portion Ox70s has, projecting along a direction perpendicular Z to the base plane (XY), a non-zero surface.

It will also be noted that the oxide film 90 can have a portion Ox50s formed by oxidation of the protective oxide layer 50 surmounting the hard mask 150 covering the gate 130.

As will be detailed below, this main oxidation step in particular has an interest in protecting the dielectric layer 40 extending into planes parallel YZ, ZX to the favoured direction Z of anisotropic etching. This protection makes it possible to limit the lateral consumption, involuntary but inevitable, of the dielectric layer during the subsequent etching step.

Typically, if the dielectric layer is made of $Si_xN_y$, thus the first portions Ox41f, Ox141f of the oxide film can be $Si_xO_yN_zF_t$, x, y, z, t, being integers.

Typically, the thickness of the oxide film 90 is of between 2 and 4 nanometre. It will be noted that according to the parameters of the main oxidation step, in particular with a zero, even very low bias voltage (typically less than 50V or 30V), the thickness is substantially equal on all the surfaces. Thus, a thickness $e_{Ox141f}$ equal to the thickness $e_{Ox30s}$ can be had.

This main oxidation step is preferably carried out in etching equipment such as a plasma etching reactor. Preferably, the reactor is an ICP or CCP reactor. Preferably, this main oxidation step is carried out in the same reactor as the preceding steps.

The plasma enabling the oxidation is formed from an oxygen-based chemistry.

Preferably, the bias voltage is zero or very low in order to avoid damaging the semi-conductive material of the structure 30. More generally, the bias voltage is less than 50V and preferably less than 30V.

The duration of the oxidation is preferably of between 5 and 30 seconds and preferably of between 10 and 20 seconds.

As illustrated in FIG. 5F, from the first etching, a second etching is carried out.

This etching, designated below as main anisotropic etching, corresponds to the etching described above in reference to FIG. 3E.

This main anisotropic etching aims to fully remove the first protective oxide layer 60 located on the upper portion of the dielectric layer 40 covering the flanks 32 of the Fins 30 while conserving a portion $e_{70b}$ of the second protective oxide layer 70 on the upper face 31 of the structure 30, e.g. the Fins of the FinFET transistor.

This aim is more easily achieved that the thickness $e_{70}$ of the second protective oxide layer 70 is thicker than that $e_{60}$ of the first protective oxide layer 60.

Preferably, during this step, also a portion (not illustrated) of the thickness of the protective oxide layer formed above the insulating layer 20 is preserved.

This step is time-controlled.

Typically, during the prior step described above, a thickness of at least 1 nm and preferably of at least 1 nm of the protective oxide layer 70 is consumed.

Preferably, this thickness consumed during this second etching is less than 8 nm and preferably less than 4 nm and preferably less than 2 nm.

Preferably, this step is carried out such that the protective oxide layer 70 conserved to protect the top 31 of the Fins has a residual thickness $e_{70b}$ such that $e_{70b} \geq 1$ nm and preferably $e_{70b} \geq 2$ nm. This thickness makes it possible to effectively protect the Fins 30.

This main anisotropic etching step is, for example, carried out in etching equipment of the inductive coupling plasma (ICP) reactor, or capacitive coupling plasma (CCP) reactor type. Preferably, it is carried out in the same reactor as the preceding steps.

This etching step is based on a chemistry comprising a fluorine (F)-based compound. Preferably, this chemistry comprises a fluorocarbon type, for example taken from among the following types $C_xH_yF_z$ or $C_xH_y$, x, y and z being integers, thus such as $CF_4$ for example, the same chemistry can be used as for the prior etching step, preferably with a bias voltage lower than during the prior etching, this in order to limit the consumption of the underlying layers, in particular, of the layer made of semi-conductive material.

It is also possible to use $S_xF_y$-based chemistries, such as $SF_6$. It must however be ensured that the etching with this type of chemistry is not too rapid, in order to not damage the layer of semi-conductive material.

Preferably, the fluorocarbon chemistry also comprises at least one additional type of dilution or separation, such as argon (Ar), oxygen (O), helium (He) or nitrogen (N). Argan can have the disadvantage of making the etching speed to high. Typically, the thickness, taken along the direction Z, of the protective oxide layer that is etched during this main anisotropic etching is less than 4 nm and preferably less than 2 nm. Typically, the etching speed of the protective oxide layer is of around 10 nm/m.

This main anisotropic etching is interrupted, by controlling the duration thereof:
  before the whole protective oxide layer 70 is consumed, or at the very least, before starting to consume the structure 30 made of underlying semi-conductive material, or at the very least, before consuming a structure 30 thickness of it, likely to degrade the performance of the transistor;
  before the whole oxide film Ox141f is consumer, or at the very least, before starting to laterally consume the portions 141 of dielectric layer extending parallel to the favoured direction Z of the etching or at the very least before consuming a thickness of it, likely to degrade the performance of the spacers.

In FIG. 5F, the case has been illustrated, where the main anisotropic etching is stopped before consumption of the whole thickness of the protective oxide layer 70 (there remains a thickness $e_{70b}$), and before consumption of the whole thickness of the first portion Ox141f of the oxide film 90 (there remains a thickness $e_{Ox141f}$).

Thus, these two conditions are observed to determine the moment of stopping the main anisotropic etching. This is, indeed, about avoiding:
  a consumption or an excessive consumption, vertical, of the structure 30 made of semi-conductive material,
  a consumption or an excessive consumption, lateral, or the dielectric layer 40.

From this main anisotropic step, the sequence of steps comprising the prior etching, the main oxidation and the main anisotropic etching is repeated.

All throughout each sequence:
  the upper face 31 of the structure 30 remains extended by the protective oxide layer 70 formed by deposition during the prior etching of each sequence,
  the lateral walls of the portions 141 of the dielectric layer which extend perpendicularly to the base plane XY, remain protected by the first portion Ox141f of the oxide film 90.
  Preferably, this is the same for the upper face of the insulating layer 20 which remains protected by the protective oxide layer 90.

However, during each prior etching step, the portions 41 of dielectric layer 40 covering the flanks 32 of the Fin 30 themselves have been highly consumed along the favoured etching direction Z.

FIGS. 5G to 5I illustrate an additional sequence.

FIG. 5G illustrates the result of the prior etching of this additional sequence. It can be seen in this FIG. that the thickness of the structure 30 has not been consumed and the upper face 31 thereof is still covered by a protective oxide layer 70, of which the thickness $e_{70c}$ has increased with respect to that $e_{70}b$ of the preceding step. The portions 41 of dielectric layer 40 covering the flanks 32 of the structure 30 themselves have been significantly consumed 41'.

FIG. 5H illustrates the result of the main oxidation with the formation of the oxide film 90.

FIG. 5I illustrates the result that is obtained from a main anisotropic etching after having repeated the sequence of steps. As illustrated, the portions 41 of dielectric layer 40 covering the flanks 32 of the Fin 30 are fully consumed. However, the height $e_{30}$ of the Fin 30 has not been consumed or has only been very slightly consumed. Moreover, the portion Ox141f of the oxide film 90 has effectively protected the portions 141 of the dielectric layer covering the flanks of the gate 130. The dimensional control of the dielectric layer 40 now forming spacers 140 on the flanks of the gate 130 has thus been perfectly conserved.

Then, the protective oxide layers 50, 70, and possibly 60 if it remains can be removed. For this, a wet removal can for example be proceeded with, for example by using a HF (hydrofluoric acid) bath. In this case, it is possible that a slight consumption of the insulating layer 20 is had, but the oxide-based protective layers 50, 60, 70 will be etched quicker. Indeed, the oxide-based protective layers 50, 60, 70 are not very dense through the deposition method thereof. They are thus etched a lot quicker than a BOX.

In the case of the embodiment of a FinFET transistor, and as indicated in the embodiment described in reference to FIGS. 3A to 3G, it is provided that the thickness $e_{150}$ of the hard mask 150 surmounting the gate 130 is greater than or equal to the thickness $e_{30}$ of the Fin 30, this such that the flanks 131 of the gate 130 remain fully covered by the dielectric layer 141, even after complete etching of the dielectric layer 41 covering the flanks 32 of the Fin 30.

Figure 6:
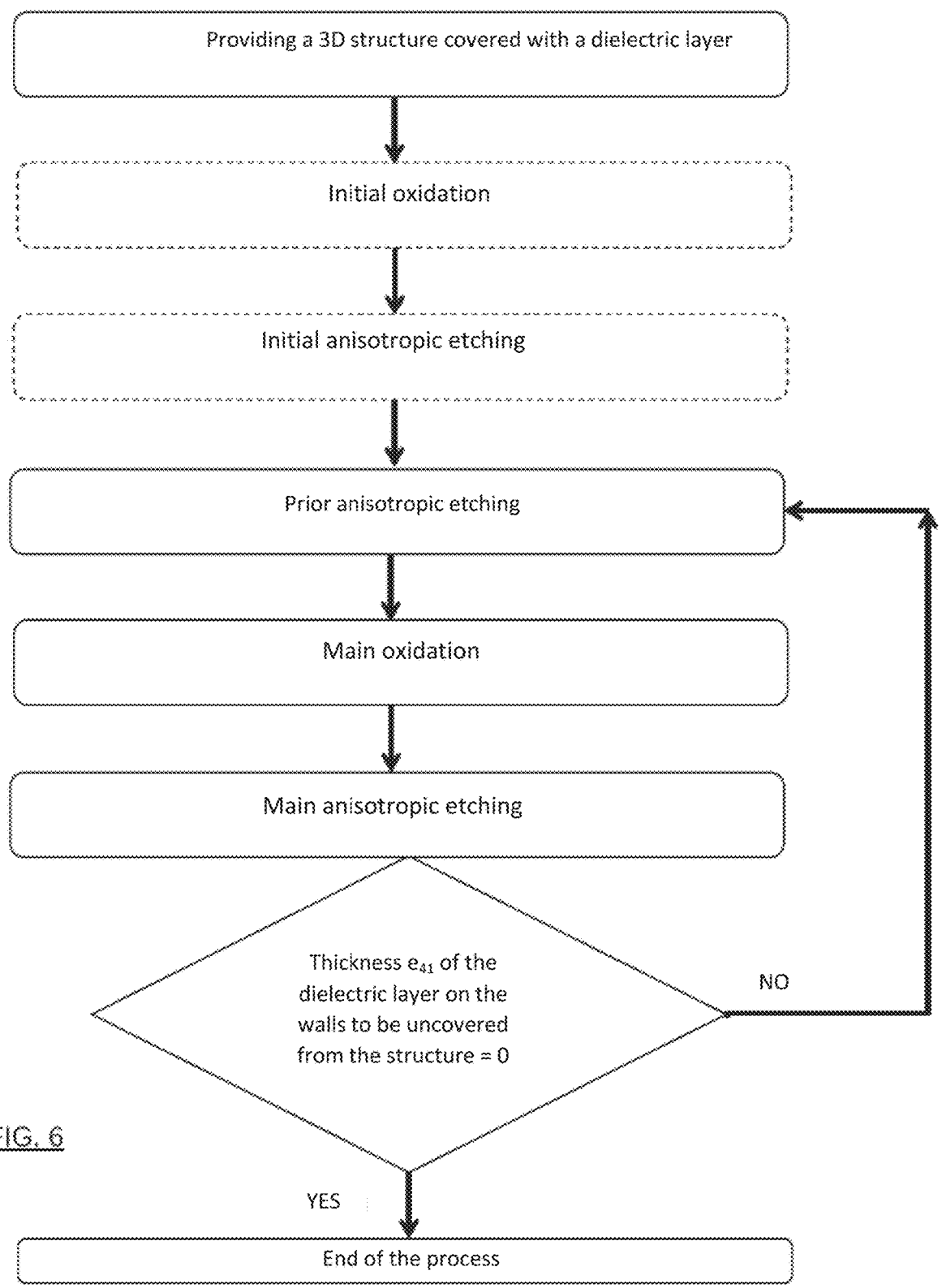
FIG. 6 is a flowchart illustrating some of the steps of the method illustrated in FIG. 5.

FIG. 6 shows, in the form of a flowchart, the main steps of the embodiment illustrated in reference to FIGS. 5A to 5I.

Preferably, all the steps of this embodiment are carried out in the same plasma reactor, which makes it possible to reduce the manufacturing cycles and to reduce the implementation cost of the method.

A non-limiting embodiment example will now be described.

The material of the dielectric layer is silicon nitride SiN. The semi-conductive material of the 3D structure (Fin 30 in this example) is silicon (Si). It will be noted that the following materials to also suit the example mentioned below, are SiC, SiCN, or SiCBN.

The initial thickness $e_{30}$ of the Fin 30 is of around 32 and 56 nm. The dielectric layer 40 has an initial thickness $e_{10}$ of between 8 and 12 nanometres, and of around 8 nm in this example.

The prior etching, of which the result is illustrated in FIG. 5C can be performed by implementing the following conditions:

TABLE 5

Initial etching (FIG. 5C)

| | |
|---|---|
| Thickness of SiN conserved from the etching: | 2-3 nm |
| Thickness $e_{11}$ of etched SiN: | 6 nm |
| Chemistry: | $CHF_3$: 30 sccm |
| | He: 220 sccm |
| Plasma type | ICP, CCP, pulsed or continuous |
| Power of the source: | 300 Watts |
| Bias voltage: | 65 Volts |
| Pressure: | 5 milli Torr |
| Temperature of the support substrate: | 60 °C. |
| Time: | 20 seconds |

The sequences of steps of which the result is illustrated in FIG. 5I can be performed by implementing the following conditions:

TABLE 6

Sequence of steps: Prior etching (FIGS. 5D, 5G)

| | |
|---|---|
| Chemistry: | $CHF_3$: 200 sccm or other gas of type $C_xH_yF_z$ |
| | $O_2$: 200 sccm |
| | He: 120 sccm |
| | $CH_4$: 0 to 20 sccm |
| | $SiCl_4$: 5 sccm and more generally between 2 and 15 sccm |
| Plasma type | ICP, CCP |
| Pulsed plasma | Pulsed between 10% and 90%; preferably 50% at 200 Hz to 5 kHz, preferably 500 Hz |
| Power of the source: | 400 Watts |
| Bias voltage: | 250 Volts |
| Pressure: | 10 to 100 milli Torr, preferably 90 milli Torr |
| Time: | Between 10 and 30 seconds, preferably 20 seconds |
| Temperature of the support substrate: | 60 °C. between 20 °C. and 100 °C. |

During this step, the plasma can be continuous or pulsed. A pulsed plasma makes it possible to limit more effectively the damage of the silicon layer. The frequency of the pulsed plasma is preferably of between 200 Hz and 5 kHz, preferably of around 500 Hz, with an activation rate of 10% to 90%, and typically of 50%.

Typically, during this first etching step, an SiN thickness is etched on the flanks 32 of the Fin 30 of around 5 nm. An SiN thickness is etched on the top 31 of the Fin 30 of around 5 nm.

TABLE 7

Main oxidation (FIGS. 5E, 5H)

| | |
|---|---|
| Nature of the dielectric layer 40 | SiN |
| Nature of the semi-conductive structure 30 | Si |
| Thickness of the oxide film 90 formed by oxidation | 2 to 4 nm, for example |
| Chemistry: | $O_2$: 200 sccm |
| Plasma type | ICP, CCP, pulsed or continuous |
| Power of the source: | 1000 Watts |
| Bias voltage: | 0 Volts |
| Pressure: | 10 milli Torr |

TABLE 7-continued

Main oxidation (FIGS. 5E, 5H)

| | |
|---|---|
| Temperature of the support substrate: | 50 °C. |
| Time: | 10 seconds |

As indicated above, a zero bias voltage makes it possible to avoid, or at the very least, limit the consumption of silicon.

TABLE 8

Main anisotropic etching (FIGS. 5F, 5I)

| | |
|---|---|
| Chemistry of the plasma: | $CHF_3$: 30 sccm |
| | He: 220 sccm |
| Plasma type | ICP |
| Power of the source: | 300 Watts |
| Bias voltage: | 65 Volts |
| Pressure: | 5 milli Torr |
| Temperature of the support substrate: | 60 °C. |
| Time: | 3 seconds |

In an alternative, the conditions of the following table can also be applied:

TABLE 9

| | |
|---|---|
| Chemistry of the plasma: | $CH_2F_2$: 95 sccm |
| | $O_2$: 63 sccm |
| | He: 50 sccm |
| | $CH_4$: 20 sccm |
| Plasma type | ICP |
| Power of the source: | 400 Watts |
| Bias voltage: | 100 Volts |
| Pressure: | 40 milli Torr |
| Temperature of the support substrate: | 60 °C. |
| Time: | 30 seconds |

Preferably, all the steps of this embodiment are carried out in the same plasma reactor, which makes it possible to reduce the manufacturing cycles and to reduce the implementation cost of the method.

The embodiment which has been described in detail above in reference to FIGS. 5A to 5I and 6, makes it possible to rapidly etch the dielectric layer along the favoured etching direction, while controlling with a great, also improved accuracy, the dimensional control of the dielectric layer intended to form the gate spacers.

In view of the preceding description, it clearly appears that the present invention proposes an effective solution to fully etch and with a great accuracy, the dielectric layer on the top and the faces of a 3D structure, while avoiding both damaging this 3D structure and laterally consuming the dielectric layer covering the walls parallel to the favoured implantation direction. Typically, the etching of the dielectric layer is done with an atomic (or close to atomic) accuracy of the etched monolayer.

The invention is not limited to the embodiments described above, and extends to all the embodiments covered by the claims.

For example, the method cannot comprise any initial etching step.

Although it has, as a particularly advantageous application, the production of FinFET-type transistors, the invention applies to all the etchings of a dielectric layer having a three-dimensional structure. Thus, it will have an application in the production of nanowires, for example.

The invention claimed is:

1. A method for etching a dielectric layer covering at least partially a flank of at least one structure made of a semi-conductive material, flanks extending into planes perpendicular to a base plane on which rests the structure having at least one face not perpendicular to the base plane, the method comprising a plurality of sequences each comprising at least the following successive steps:
   a main oxidation of the dielectric layer, so as to form an oxide film covering the structure, the oxide film having at least:
      one first portion formed on a surface of the dielectric layer and extending into a plane perpendicular to the base plane,
      one second portion formed on the dielectric layer and having, projecting over the base plane, a non-zero surface, and
      one third portion formed on the face and having, projecting over the base plane, a non-zero surface,
   a main anisotropic etching of the oxide film, by plasma, the main anisotropic etching being carried out so as to:
      have a favored direction perpendicular to the base plane,
      etch the second portion and at least some of the dielectric layer located under the second portion, and be stopped before etching:
         the structure made of semi-conductive material, and
         the portions of the dielectric layer on which at least one first portion of the oxide film has been formed during the main oxidation step,
   the steps being repeated until complete removal of the dielectric layer located on the flanks of the structure made of semi-conductive material,
   wherein prior to the plurality of sequences, the dielectric layer covers the flanks of the structure and at least one portion of the face of the structure not being covered by the dielectric layer.

2. The method according to claim 1, wherein the main anisotropic etching of the oxide film, by plasma, uses a fluorocarbon chemistry.

3. The method according to claim 1, wherein the structure forms at least one Fin of a FinFET-type transistor.

4. The method according to claim 1, wherein the structure is surmounted by a gate pattern having flanks covered by the dielectric layer, the gate pattern being surmounted by a hard mask of which a thickness $e_{150}$ is greater than or equal to a thickness $e_{30}$ of the structure, the thicknesses $e_{150}$ and $e_{30}$ being taken along the favored direction.

5. The method according to claim 1, wherein the main oxidation is carried out in a plasma etching reactor and the main anisotropic etching is carried out in a same plasma etching reactor.

6. The method according to claim 1, wherein prior to the plurality of sequences, the method further comprises:
   a step of depositing the dielectric layer such that the dielectric layer covers the flanks and the face of said structure; and
   an initial etching step, carried out anisotropically along said favored direction so as to remove at least some of the dielectric layer located on at least some of the face of the structure, the initial etching being stopped before consuming the face of the structure.

7. The method according to claim 6, wherein, after the step of depositing the dielectric layer and before the initial etching step, the method further comprises an initial oxidation step, carried out so as to form an initial oxide film over a whole surface of the dielectric layer.

8. The method according to claim 7, wherein the initial etching step is stopped before consuming the whole thickness of portions of the initial oxide film located on surfaces of the dielectric layer extending into planes perpendicular to the base plane.

9. The method according to claim 6, wherein the initial etching step is a plasma etching based on a fluorinated chemistry, diluted with one or more from among the following types: argon; helium, nitrogen, and oxygen.

10. The method according to claim 1, wherein prior to the plurality of sequences; the dielectric layer covers the flanks of the structure.

11. The method according to claim 10, wherein during the main oxidation step, the at least one third portion of the oxide film is formed by oxidation of the face of the structure, a composition of the second portion of the oxide film being different from a composition of the third portion of the oxide film, and the main anisotropic etching being configured so as to etch the second portion of the oxide film more rapidly than the third portion of the oxide film.

12. The method according to claim 10, wherein the composition of the second portion of the oxide film is $Si_xO_yN_zF_t$ and the composition of the third portion of the oxide film is $Si_xO_yF_z$, with x, y, z, and t being integers.

13. The method according to claim 10, wherein the main anisotropic etching of the oxide film is carried out so as to be stopped before etching the whole thickness of the third portion of the oxide film.

14. The method according to claim 10, wherein the main oxidation is carried out in a plasma etching reactor, by using a bias voltage less than or equal to 50 Volts.

15. The method according to claim 1, wherein each sequence comprises, before the main oxidation:
a prior anisotropic etching of the dielectric layer, by plasma, by using a chemistry comprising at least:
one fluorocarbon chemistry comprising a first compound being fluorine-based,
one second compound taken from among $S_wCl_{(2w+2)}$ $Si_wF_{(2w+2)}$, with y, and z being non-zero integers, and oxygen,
the prior anisotrophic etching being carried out so as to:
generate an ionic bombardment directly mainly along the favored direction,
adjust a quantity of the first compound to consume all the fluorine-based compound during the prior anisotrophic etching so as to interrupt the prior anistrophic etching after having consumed at least some of the dielectric layer located on the flanks of the structure,
deposit a first protective oxide layer, of thickness $e_{60}$, on a surface of portions of the dielectric layer having, projecting over the base plane, the non-zero surface, and
deposit a second protective oxide layer, of thickness $e_{70}$, on a surface of the face, the thickness $e_{70}$ being greater than the thickness $e_{60}$, due to a difference in composition of the first protective oxide layer and of the second protective oxide layer,
the main anisotropic etching being carried out so as to:
fully etch the first protective oxide layer, and
be stopped before fully etching a whole thickness $e_{70a}$ of the second protective oxide layer, or at least etch the structure made of semi-conductive material located under the second protective oxide layer.

16. The method according to claim 15, wherein the first fluorine-based compound of the chemistry used for the prior anistrophic etching step originates from the chemistry used during an initial etching step.

17. The method according to claim 15, wherein, prior to the plurality of sequences, the method further comprises:
a step of depositing the dielectric layer such that the dielectric layer covers the flanks and the face of the structure, and
an initial etching step, carried out anisotropically along the favored direction so as to remove at least some of the dielectric layer located on at least some of the face of the structure; the initial etching being stopped before consuming the face of the structure, and wherein the initial etching step is interrupted so as to conserve a portion of the dielectric layer located on the face of the structure made of semi-conductive material, the initial etching step being based on a fluorocarbon chemistry.

18. The method according to claim 15, wherein the main anisotropic etching is a fluorinated or fluorocarbon chemistry-based etching.

19. A method for producing a FinFET transistor surmounting a support substrate, the FinFET transistor comprising a gate and at least one channel passing through the gate, the channel and extending from a flank of the gate to form at least one structure having an upper face and at least two flanks, the method comprising:
deposition of a dielectric layer covering the gate and the structure; and
etching of the dielectric layer by implementing the method according to claim 1, so as to completely remove the dielectric layer located on the structure formed by channel.

20. The method according claim 19, wherein the transistor has a hard mark covering a top of the gate, the dielectric layer being deposited on the hard mask, the hard mask having a thickness $e_{150}$, such that $e_{150} \geq e_{30}$, $e_{30}$ being a thickness of the structure.

* * * * *